US009906354B2

(12) United States Patent
Khlat

(10) Patent No.: US 9,906,354 B2
(45) Date of Patent: Feb. 27, 2018

(54) SPLIT BAND FILTERING WITH TWO SAW FILTERS AND SINGLE TUNABLE FILTER

(71) Applicant: RF Micro Devices, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 14/254,343

(22) Filed: Apr. 16, 2014

(65) Prior Publication Data
US 2014/0307592 A1    Oct. 16, 2014

Related U.S. Application Data

(60) Provisional application No. 61/812,454, filed on Apr. 16, 2013.

(51) Int. Cl.
*H04L 5/14* (2006.01)
*H04B 1/00* (2006.01)
(Continued)

(52) U.S. Cl.
CPC ........... *H04L 5/1461* (2013.01); *H04B 1/006* (2013.01); *H04B 1/0064* (2013.01);
(Continued)

(58) Field of Classification Search
USPC .... 455/114.2, 168.1, 200.1, 266, 452.1, 509, 455/63.3, 63.1; 370/278, 281; 333/195
See application file for complete search history.

(56) References Cited

U.S. PATENT DOCUMENTS 5,023,866 A * 6/1991 De Muro .............. H01P 1/2136
                                                                333/126
7,299,006 B1 * 11/2007 Rofougaran ........... H03D 3/244
                                                                323/267
(Continued)

FOREIGN PATENT DOCUMENTS

GB    2512586 b  *  4/2013  ............... H04B 1/00
GB    2512668 A  *  4/2013  ............... H04B 1/00
GB    2512668 A  *  10/2014  ............. H04B 1/006

OTHER PUBLICATIONS

U.S. Appl. No. 61/812,454, Khlat, Nadim, Tunable Single Filter for LTE TDD, filed Apr. 16, 2013.*
(Continued)

*Primary Examiner* — Edward Urban
*Assistant Examiner* — Ralph H Justus
(74) *Attorney, Agent, or Firm* — Withrow & Terranova, P.L.L.C.

(57) ABSTRACT

The disclosure includes communication circuitry with a tunable filter configured to tunably filter in a split band. In a first embodiment, communication circuitry includes a tunable filter and a first additional filter. The communication circuitry is configured to communicate within a low target band and within a high target band, wherein an exclusion band is located between the low target band and the high target band. The tunable filter is configured to filter within a low tunable band when tuned within the low tunable band, and configured to filter within a high tunable band when tuned within the high tunable band. The first additional filter is configured to filter in a first additional filter band located in an upper edge of the low target band.

15 Claims, 21 Drawing Sheets

(51) Int. Cl.
*H04B 1/10* (2006.01)
*H04L 5/08* (2006.01)

(52) U.S. Cl.
CPC ... *H04B 1/1027* (2013.01); *H04B 2001/1072* (2013.01); *H04L 5/08* (2013.01); *H04L 5/14* (2013.01)

(56) References Cited

U.S. PATENT DOCUMENTS

| | | | |
|---|---|---|---|
| 8,811,241 B2* | 8/2014 | Wilhelmsson | H04W 16/14 370/281 |
| 9,252,827 B2* | 2/2016 | Gudem | H04B 1/005 |
| 2005/0206478 A1* | 9/2005 | Satoh | H03H 7/465 333/133 |
| 2005/0277387 A1 | 12/2005 | Kojima et al. | |
| 2006/0160563 A1 | 7/2006 | Ku | |
| 2011/0012696 A1* | 1/2011 | Skarp | H03H 9/02007 333/195 |
| 2012/0129457 A1* | 5/2012 | Linsky | H04B 1/525 455/63.3 |
| 2012/0243447 A1* | 9/2012 | Weissman | H04B 1/0458 370/280 |
| 2013/0137475 A1* | 5/2013 | Rousu | H04W 72/0453 455/509 |
| 2013/0157717 A1* | 6/2013 | Yu | H04B 1/44 455/553.1 |
| 2013/0278350 A1* | 10/2013 | Takeuchi | H03H 7/463 333/132 |
| 2013/0324112 A1* | 12/2013 | Jechoux | H04W 72/1215 455/426.1 |
| 2014/0240059 A1* | 8/2014 | Bradley | H03H 7/42 333/133 |
| 2014/0295775 A1* | 10/2014 | Rousu | H04B 1/006 455/73 |
| 2014/0307836 A1 | 10/2014 | Khlat | |

OTHER PUBLICATIONS

U.S. Appl. No. 61/812,454, Khlat, Nadim, Tuynable Single Filter for LTE TDD, filed Apr. 16, 2013.*
Non-Final Office Action for U.S. Appl. No. 14/230,620, dated Oct. 20, 2016, 7 pages.
Advisory Action for U.S. Appl. No. 14/230,620, dated Jul. 6, 2017, 3 pages.
Non-Final Office Action for U.S. Appl. No. 14/230,620, dated Aug. 18, 2017, 9 pages.
Final Office Action for U.S. Appl. No. 14/230,620, dated Mar. 23, 2017, 9 pages.
Notice of Allowance for U.S. Appl. No. 14/230,620, dated Nov. 24, 2017, 7 pages.

* cited by examiner

B7 TRANSMIT

B7 RECEIVE

B38 TRANSMIT

B38 RECEIVE

US 9,906,354 B2

SPLIT BAND FILTERING WITH TWO SAW FILTERS AND SINGLE TUNABLE FILTER

RELATED APPLICATIONS

This application claims the benefit of provisional patent application Ser. No. 61/812,454, filed Apr. 16, 2013, the disclosure of which is hereby incorporated herein by reference in its entirety.

FIELD OF THE DISCLOSURE

The field of the disclosure is filtering signals in LTE-TDD (Long Term Evolution-Time Division Duplex) communications. Specifically, communication circuitry includes a tunable filter configured to tunably filter in a split band.

BACKGROUND

A conventional communication circuit may use 9 SAW (Surface Acoustic Wave) filters. These SAW filters facilitate split band coverage to avoid interference with a central ISM (Industrial Scientific and Medical, or WiFi) band.

Filters in a conventional communication circuit are unidirectional, and thus either filter transmission (TX) signals or filter reception (RX) signals (but never both).

FIG. 1 illustrates a conventional communication circuit with its major components. Specifically, FIG. 1 illustrates: communication circuitry COMCKT including controller CKT14, transceiver CKT2, diversity filters CKT4, diversity switches CK6, high band pad CKT8, high band filters CKT10, high band switches CKT12, diversity antenna ANTDIV, and main antenna ANTMAIN. Additionally, FIG. 2 illustrates details of transceiver CKT2, diversity filters CKT4, and diversity switches CKT6. FIG. 3 illustrates details of high band pad CKT8, high band filters CKT10, and high band switches CKT12.

Controller CKT14 may control: transceiver CKT2 through control line CL2, diversity filters CKT4 through control line CL4, diversity switches CKT6 through control line CL6, high band pad CKT8 through control line CL8, high band filters CKT10 through control line CL10, and ultrahigh band switches CKT12 through control line CL12. Controller CKT14 may include a processor and a non-transitory memory.

A control line such as CL2 may include (not shown) a voltage supply, a serial data line, parallel data lines, a clock signal, a ground, power amplifier control signals, switch control signals, and may also include return signals such as signal power measurements.

FIG. 2 illustrates a conventional transceiver, diversity filters, and diversity switches from FIG. 1. Specifically, FIG. 2 illustrates exemplary details of transceiver CKT2, diversity filters CKT4, and diversity switches CKT6 from FIG. 1.

Transceiver CKT2 includes many nodes. The node names indicate what bands are transmitted or received by the specific node. Further, "TX" indicates that a main signal is being transmitted. "DRX" indicates that a diversity signal is being transmitted. "RX" indicates that a main signal is received. Thus, the top node is named "B7 TX," indicating that a main signal (S2) in band 7 is transmitted. Further, bands such as band 40 may be referred to as "band B40" for emphasis that the number "40" refers to a band. Additionally, a filter may be referred to as filtering "band B40 RX" to emphasize that the signal being filtered is a received signal.

From top to bottom, the nodes may be grouped as follows: transmitting main signals; receiving filtered diversity high band signals from switch SW2 of diversity switches CKT6; receiving filtered diversity low band signals from switch SW4 of diversity switches CKT6; and receiving other main signals. Each of these groups is discussed in sequence below.

Two nodes transmit main signals (S2 and S4): B7 TX transmits S2; and B38/40/41/XGP TX transmits S4.

Eight nodes receive high band diversity signals (S6, S8, S10, S12, S14, S16, S18, and S24) as follows: node B41a DRX receives S6; node B1/4 DRX receives S8; node B40 DRX receives S10; node B34 DRX receives S12; node B39 DRX receives S14, node B3 DRX receives S16; node B2 DRX receives S18; node B7 DDRX receives S24.

Six nodes receive low band diversity signals (S26, S28, S30, S32, S34, and S36) as as follows: node B8/D28a DRX receives S26; node B20 DRX receives signal S28; node B26 DRX receives S30; node B13/B17 receives S32; node B29 DRX receives S34; and node B28b DRX receives S36.

Four nodes receive main band signals (S38, S40, S42, and S44): node B40a/B41a RX receives S38; node B40b RX receives S40; node B38/XGP/B41b RX receives S42; and node B7/41c RX receives S44.

Diversity filters CKT4 include filters F6, F8, F9, F11, F12, F14, F16, F18, F20, F22, F24, F25, F27, F28, F30, F32, F34, and F36.

Diversity switches CKT6 include high band switch SW2 and low band switch SW4 located on a thin SOI (silicon on insulator) die DIE2. High band switch SW2 may be a SP10T (single pole, ten throw) switch. Low band switch SW4 may be a SP7T (single pole, seven throw) switch.

High band switch SW2 receives high band diversity signal S46 at single pole SP2, and transmits high band diversity signal S46 to a selected one of ten throws (T6, T8, T9, T11, T13, T16, T18, T20, T22, and T24), to be transmitted towards diversity filters CKT4 as signals S6, S8, S9, S11, S13, S16, S18, S20, S22, and S24 respectively.

High band switch SW2 may include an additional throw (not shown) for grounding.

Low band switch SW4 receives low band diversity signal S48 at single pole SP4, and transmits low band diversity signal S48 to a selected one of seven throws (T25, T27, T28, T30, T32, T34, and T36), to be transmitted towards diversity filters CKT4 as signals S25, S27, S28, S30, S32, S34, and S36 respectively.

Three filters (F6, F9, and F11) deserve special attention for future reference. Filter F6 receives signal S6 from throw T6, and transmits filtered signal S6 to node B41a DRX in transceiver CKT2.

Filter F9 receives signal S9 from throw T9 and transmits 510 (filtered signal S9) to node B40 DRX. Filter F11 receives signal S11 and transmits signal S10 (filtered signal S11) to node B40 DRX. If switch SW2 is thrown to T9, then node B40 DRX will receive signal S9 filtered through filter F9. Alternatively, if switch SW2 is thrown to T11, then node B40 DRX will receive signal S11 filtered through filter F11. In this fashion, diversity high band signal S46 is filtered by either filter F9 (if T9 is thrown) or filter F11 (if T11 is thrown), and then transmitted as signal S10 to node B40 DRX. Of course, throws T9 and T11 may not be thrown (selected) simultaneously.

FIG. 3 illustrates a conventional high band pad CKT8, high band filters CKT10, and high band switches CKT12 from FIG. 1.

In transmit mode for band 7, high band pad CKT8 receives signal S2 (band 7 being transmitted from node B7 TX), passes this signal through capacitor CAP2 (to filter undesired very low frequency signals), amplifies this signal with amplifier PA2, and sends filtered amplified signal S2 to duplexer DUPB7.

Duplexer DUPB7 sends the amplified signal towards main antenna ANTMAIN (not shown) as signal S52 in transmit mode.

Alternatively, in receive mode for band 7, duplexer DUPB7 receives signal S52 from main antenna ANTMAIN, and sends this received signal as S50 towards a transceiver (not shown).

High band pad CKT8 also receives signal S4 (bands 38, 40 and 41 from node B38/40/41), passes this signal through capacitor CAP4 (to filter undesired very low frequency signals), amplifies this signal with amplifier PA4, and sends filtered amplified signal S4 to single pole SP6 of switch SW6.

Switch SW6 is an SP4T (single pole, four throw) having one pole (SP6) and four throws (T54, T56, T58, and T60). If switch SW6 is thrown to throw T54, then filtered amplified signal S4 (band B41 or band B38) is sent to filter F54 in high band filters CKT10. Filter 54 sends filtered signal S54 to high band switches CKT12, specifically to node TX B41b and to throw T54 in switch SW8.

Similarly, throw T56 sends signal S56 (bands B40a and B41) to filters F55 and F57. Filter 55 sends signal S55 (band 40a) to high band switches CKT12. Filter 57 sends signal S57 (band 41a).

Throw T58 sends signal S58 (band B41c) to filter F58. Filter F58 sends filtered signal S58 to high band switches CKT12. Throw T60 sends signal S60 to filter F60. Filter F60 sends filtered signal S60 to high band switches CKT12.

High band filters CKT10 includes 9 filters: transmission filters (F54, F55, F57, F58, and F60), and reception filters (F37, F39, F63, and F65). In TDD operation, one of the transmission filters is being used, or alternatively one of the reception filters is being used. Filter F60 is a low pass filter, and the other filters shown in CKT10 are band pass filters.

High band switches CKT12 include two switches: SP6T (single pole, six throw) switch SW8 (including single pole SP8 and throws T62, T60, T54, T55, T57, and T58), and SP3T (single pole, triple throw) switch SW10 (including single pole SP10 and throws T37, T39, and T64). Switch SW8 and switch SW10 may be placed on a single die DIE4. Die DIE4 may be constructed of MEMS (microelectromechanical systems) or may be solid state SOI (silicon on insulator).

Briefly referring back to FIG. 2, diversity filters CKT4 include filters F6 (band B41a DRX), F9 (band B40 DRX), and FIG. 11 (also band 40 DRX). These filters filter a signal received from the diversity or MIMO (Multiple Input Multiple Output) antenna ANTDIV. These bands are also received through the main antenna ANTMAIN, and filtered by high band filters CKT10.

Switch SW8 is a transmission switch, and transmits signal TX RF1 to main antenna ANTMAIN (not shown). For example, switch SW8 selects throw T55 to transmit band B40a TX through single pole SP8 towards main antenna ANTMAIN (not shown) as signal TX RF1.

In contrast, switch SW10 is a reception switch, and receives signal RX RF1 at single pole SP10 from main antenna ANTMAIN (not shown). For example, switch SW10 selects throw T37, then receives RX RF1 at single pole SP10 and transmits signal S37 (band B40a RX) towards filter F37 in diversity switches CKT10 in route to transceiver CKT2.

TDD (Time-Division Duplex) alternately sends and then receives signals in a given frequency band. In this fashion, band B40a may be alternately sent, and then received over main antenna ANTMAIN (not shown) through switch selections as discussed above. Similarly, band B41a may be time-division duplexed using different switch settings.

Conventionally, as shown in FIGS. 2 and 3, different filters are used for receiving and for transmitting in each band. This conventional approach requires large numbers of filters. For example, high band filters CKT10 illustrates nine filters, and these nine filters are conventionally SAW (surface acoustic wave) or BAW (bulk acoustic wave) filters.

FIG. 4 illustrates a conventional single filter used for transmission and reception of a single band. Specifically, filter F114 is used (alternately, under TDD (Time-Division Duplex) procedures) for filtering a band 38 signal for transmission, and then for filtering a received band 38 signal. Filter F114 is a "dual mode" filter because it filters the transmitted band 38 signal (in a first mode, see FIG. 5C) and also filters the received band 38 signal (in a second mode, see FIG. 5D).

Conventionally (in FIGS. 1, 2, and 3), different filters are used for transmitting and for receiving because transmitted signals are high power (typically 25 dBm, with high insertion loss filters), whereas received signals are low power (typically 0 dBm, with low insertion loss filters). Thus, filters that are dedicated to received signals may use very little power during filtering. In contrast, dual purpose filters (reception or transmission) must be relatively large, and will consume relatively large amounts of power even when filtering received low power signals.

However, there are some advantages to using a single dual purpose (or dual mode, or TX/RX) filter during LTE-TDD communications, such as reducing the number of filters, as shown in FIG. 4.

Filtering circuit CKT14 includes controller CONT4 controlled by control lines CL14, capacitor CAP6, amplifier PA6, switch SW14, switch SW12, filters (F114, F112, and F116), switch SW16, and capacitor CAPE.

Controller CONT4 may be controlled by control lines CL14 that may include a bias voltage, a battery voltage, a clock signal, serial or parallel data signals, and enable signals.

From left to right, signal S100 includes a band 7 transmission signal or a band 38 transmission signal, is filtered by capacitor CAP6, amplified by amplifier PA6, received by single pole SP110 of switch SW14, then switched to throw T112 for the case of a band 7 transmission signal (or switched to throw T114 for the case of a band 38 transmission signal).

FIGS. 5A-5D illustrate the use of a single filter (F114) for transmitting and receiving in band 38 for LTE-TDD communications. Filter F114 is a "dual mode" filter because it filters the transmitted band 38 signal (in a first mode, see FIG. 5C) and also filters the received band 38 signal (in a second mode, see FIG. 5D).

FIG. 5A illustrates the switches and filtering of circuit CKT14 in FIG. 4 for the case of transmitting band 7 (while omitting capacitors, amplifiers, and the controller for the sake of clarity). As discussed above, switch SW14 throws the signal S100 to throw 112. This signal proceeds as signal S102 to filter F112, is filtered, then proceeds as signal S106 to throw T126 of switch SW16.

Signal S106 proceeds from throw T126 to single pole SP120, then exits as signal S110 towards main antennal ANTMAIN.

FIG. 5B illustrates the switches and filtering for the case of receiving band 7 (omitting capacitors, amplifiers, and the controller for the sake of clarity).

A band 7 signal is received by the main antenna ANTMAIN as S110 (or B7 RX), and is sent to single pole SP120 of switch SW16. Single pole SP120 throws the signal to throw T126, and the signal exits as S106 towards filter F116. Filter F116 filters the signal and sends the filtered signal as S114 (B7 RX) towards another location, such as towards a transceiver (not shown). Filter F116 may include a balun (not shown), and may output the received and filtered band 7 signal S114 as differential signals (a positive signal and a negative signal, not shown).

The position of switch SW14 is not shown in FIG. 5B. Power amplifier PA6 may be turned off when receiving the band 7 signal, or switch SW14 may be thrown to throw T114, or switch SW14 may be thrown to a ground (not shown). In other words, generally circuit CKT14 would not simultaneously transmit and receive in band 7, or else the high power transmission band 7 signal would tend to interfere with the relatively low power received band 7 signal.

FIG. 5C illustrates the switches and filtering for the case of transmitting band 38 (omitting capacitors, amplifiers, and the controller for the sake of clarity). Band 38 will be transmitted and received through the same filter F114 (transmitted in FIG. 5C, and received in FIG. 5D).

Switch SW14 throws signal S100 (B38 TX) from single pole SP110 to throw T114. Throw T114 send signal S104 to filter F114. Filter F114 sends filtered signal S108 to throw T124 of switch SW16, then to single pole SP120 of switch SW16. Single pole SP120 sends band 38 signal S110 to main antenna ANTMAIN for transmission.

FIG. 5D illustrates receiving band 38 through filter F114 (previously used for transmitting in the same band 38 in FIG. 5C). FIG. 5D is based on FIG. 4, but omits capacitors, amplifiers, and the controller for the sake of clarity). Thus, FIGS. 5C and 5D illustrate single filter F114 being used for transmitting and receiving the same band 38 in TDD.

In FIG. 5D, a band 38 signal S110 is received by main antenna ANTMAIN and sent to single pole SP120 of switch SW16. Switch SW16 throws the signal to throw T124, then throw T124 sends signal S108 to filter F114. As discussed above, filter F114 now acts as a receiving filter in band 38, instead of as a transmitting filter in band 38. Switch SW12 receives filtered signal S104 at throw T114, and throws this signal to single pole SP120. Single pole SP120 sends received and filtered band 38 signal S112 upwards, possibly to a transceiver. Note that throw T114 of switch SW12 also serves as throw T114 of switch SW14.

Received and filtered band 38 signal S112 may be transformed by a balun (not shown) into differential signals (a positive signal and a negative signal, not shown).

Thus, single filter F114 may alternately serve as a transmission filter (in FIG. 5C) and as a reception filter (in FIG. 5D) during time-division duplexing (TDD) in band 38.

FIG. 6 illustrates using single filters (to transmit and receive) for multiple LTE bands. In FIG. 6, filters F210 and F212 may each be used for filtering in a transmit mode (first mode) and then in a receive mode (second mode), similar to filter F114 discussed above in FIG. 4, 5C, and 5D.

Specifically, circuit CKT16 includes amplifier circuit CKT18, SP2T (single pole, double throw) switches SW20 and SW22, and filters F210 and F212. Solid signal lines indicate the paths of transmission signals, and dashed lines indicate the paths of reception signals.

Starting at the top left, signal S210 is a transmission signal for bands B38, B40, B41, and XGP. This signal is amplified by amplifier PA10 and sent as signal S212 to switch SW20. Switch SW20 throws this signal to filter F210 as signal S214. Filter F210 transmits filtered signal S216 towards an antenna (not shown. Filter F210 may also filter reception signals (dashed lines) in these bands.

Starting at the top right, filter F210 may receive a signal (dashed line, S218) from the antenna, and filter the signal and pass it to switch SW20. Switch SW20 throws this filtered signal to the lower left pole, and this signal passes to the left and down as signal S218. Thus, switch SW20 will be in a first position when transmitting, and in a second position when receiving signals in bands B38 or B41 or XGP.

Similarly, switch SW22 and filter F212 may filter and transmit a signal in band B40, or may receive and filter a signal in band B40 (depending upon the position of switch SW22.

When transmitting a band B40 signal S220, amplifier PA8 amplifies the signal, filter F214 filters the signal and sends filtered signal S222 to switch SW22, switch SW22 throws the signal to filter F212 as signal S224, then filter F212 filters the signal and sends signal S226 towards an antenna (not shown, and not necessarily the same antenna that signal S216 was sent to).

Starting at the bottom right, filter F212 may receive and filter a band 40 signal (dashed line S228)), then send the filtered signal to switch SW22. Switch SW22 throws this signal to the left and downward as S228.

The received signals S218 and S228 may be transformed into differential signals by baluns (not shown).

Thus, conventional communication circuitry requires too many filters. These numerous filters consume power and take up valuable space.

SUMMARY

A split band tunable filter reduces the total number of filters used in TDD (Time-Division Duplex) communication circuitry.

In a first embodiment, communication circuitry may include a tunable filter and a first additional filter. The communication circuitry is configured to communicate within a low target band and within a high target band, wherein an exclusion band is located between the low target band and the high target band.

The tunable filter is configured to filter within a low tunable band when tuned within the low tunable band, and configured to filter within a high tunable band when tuned within the high tunable band. The first additional filter is configured to filter in a first additional filter band located in an upper edge of the low target band.

In a second embodiment, communication circuitry may include a tunable filter and a first additional filter. The communication circuitry is configured to communicate within a low target band and within a high target band, wherein an exclusion band is located between the low target band and the high target band. The tunable filter is configured to filter within a low tunable band when tuned within the low tunable band and configured to filter within a high tunable band when tuned within the high tunable band. The low tunable band is equivalent to the low target band. The first additional filter is configured to filter within a first additional filter band located in a lower edge of the high target band. The high tunable band and the first additional filter band combine to completely cover the high target band.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Figure 7:
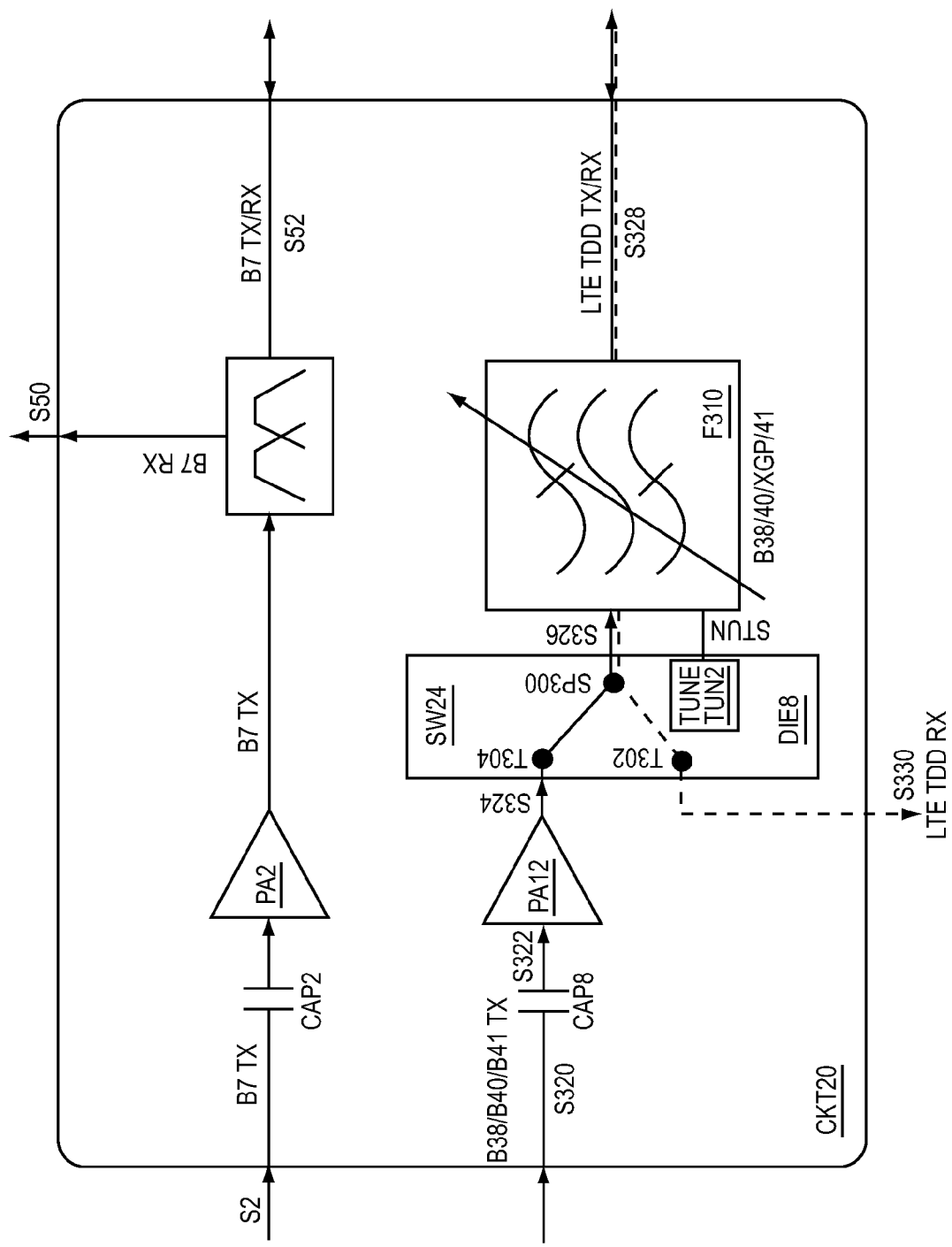
FIG. 7 illustrates a power amplifier circuit associated with a dual mode tunable filter (also known as a combined tunable filter), with a first mode for transmitting and a second mode for receiving.

FIG. 7 illustrates an amplifier circuit CKT20 including tunable filter and an associated switch. The tunable filter may include filtering component F310 and tuning component TUN2.

Tuning component TUN2 may be a variable capacitor or an array of capacitors, and may be located with associated switch SW24 on single die DIE8.

Figure 8:
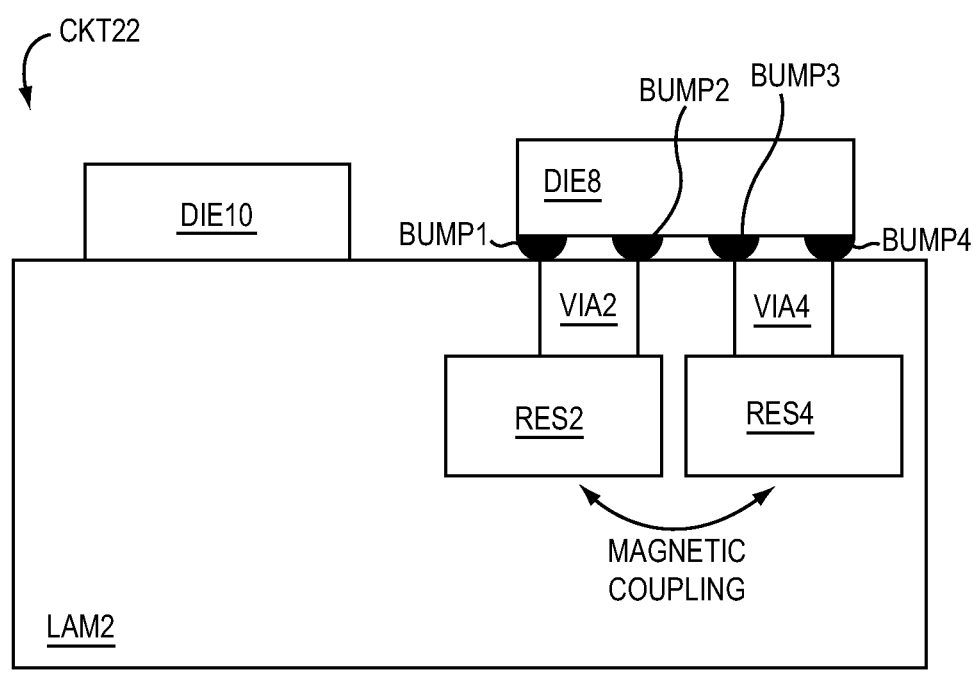
FIG. 8 illustrates a manufacturing embodiment of FIG. 7.

The tuning component TUN2 and the associated switch SW24 may use the same manufacturing technology, facilitating their placement on a single die. For example (as shown in FIG. 8), they may be manufactured by a single process such as SOI (Silicon-on-Insulator), or MEMS, or SiGe with high resistivity. This integration is not essential, but such integration will reduce size and cost.

Figure 1:
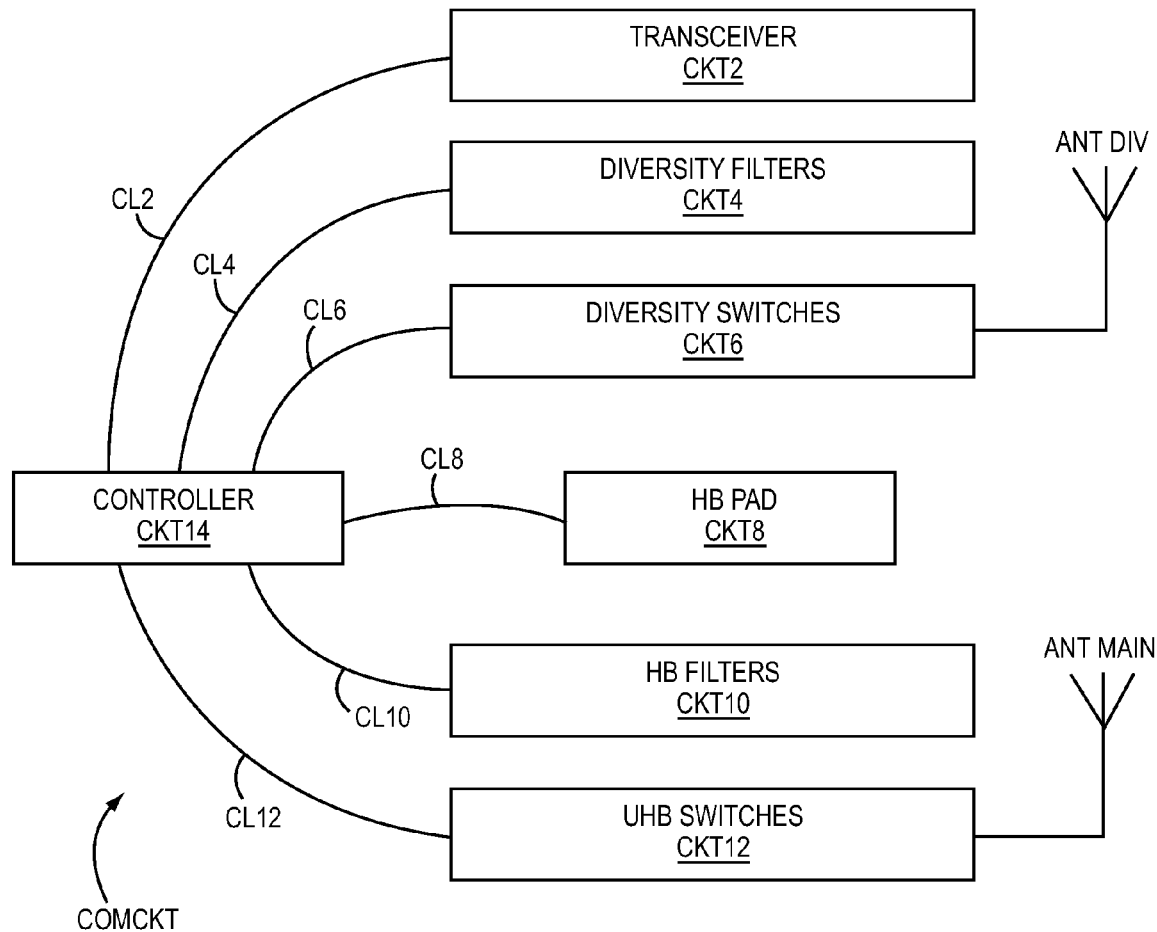
FIG. 1 illustrates a conventional communication circuit with its major components.
Figure 2:
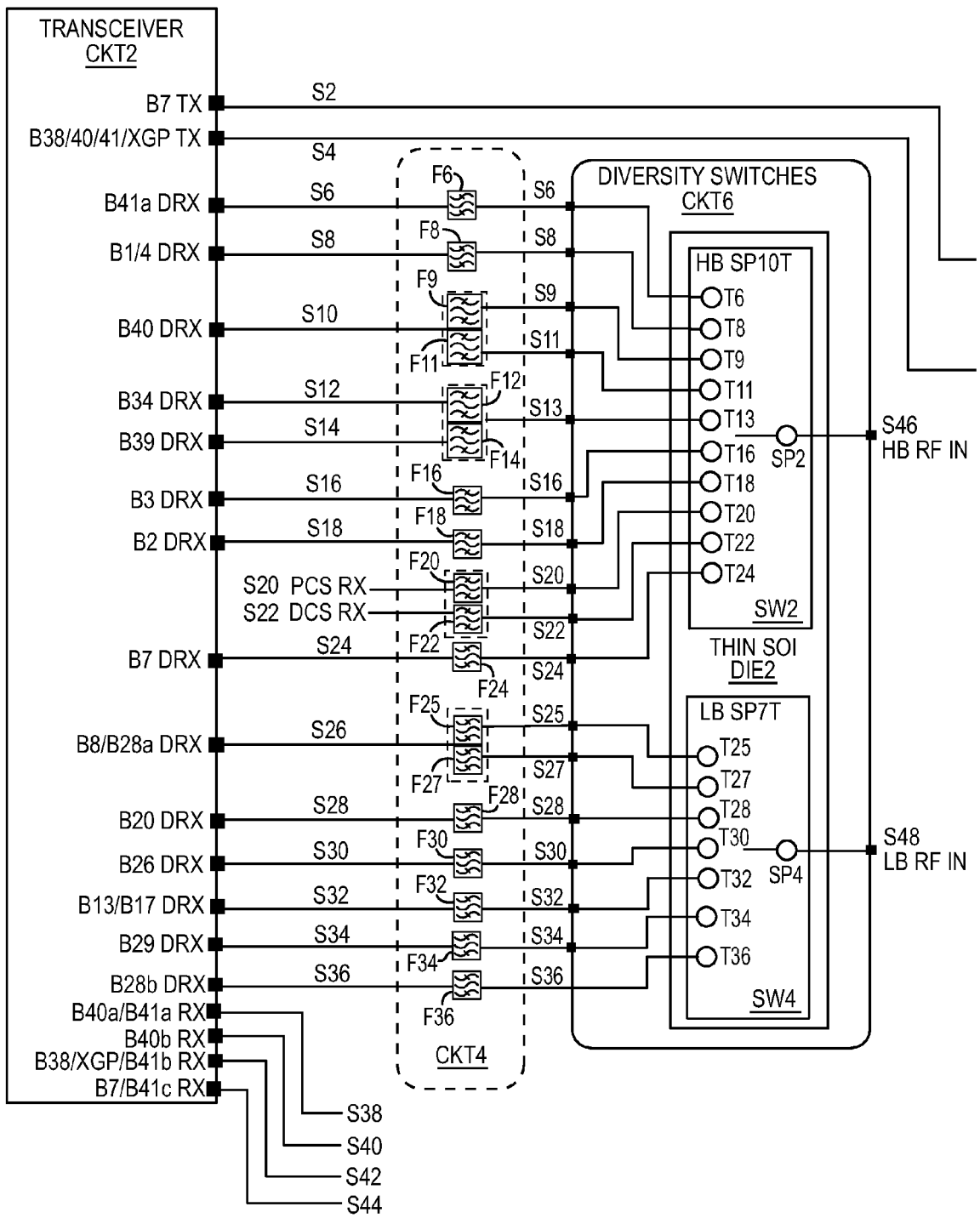
FIG. 2 illustrates a conventional transceiver, diversity filters, and diversity switches from FIG. 1.
Figure 3:
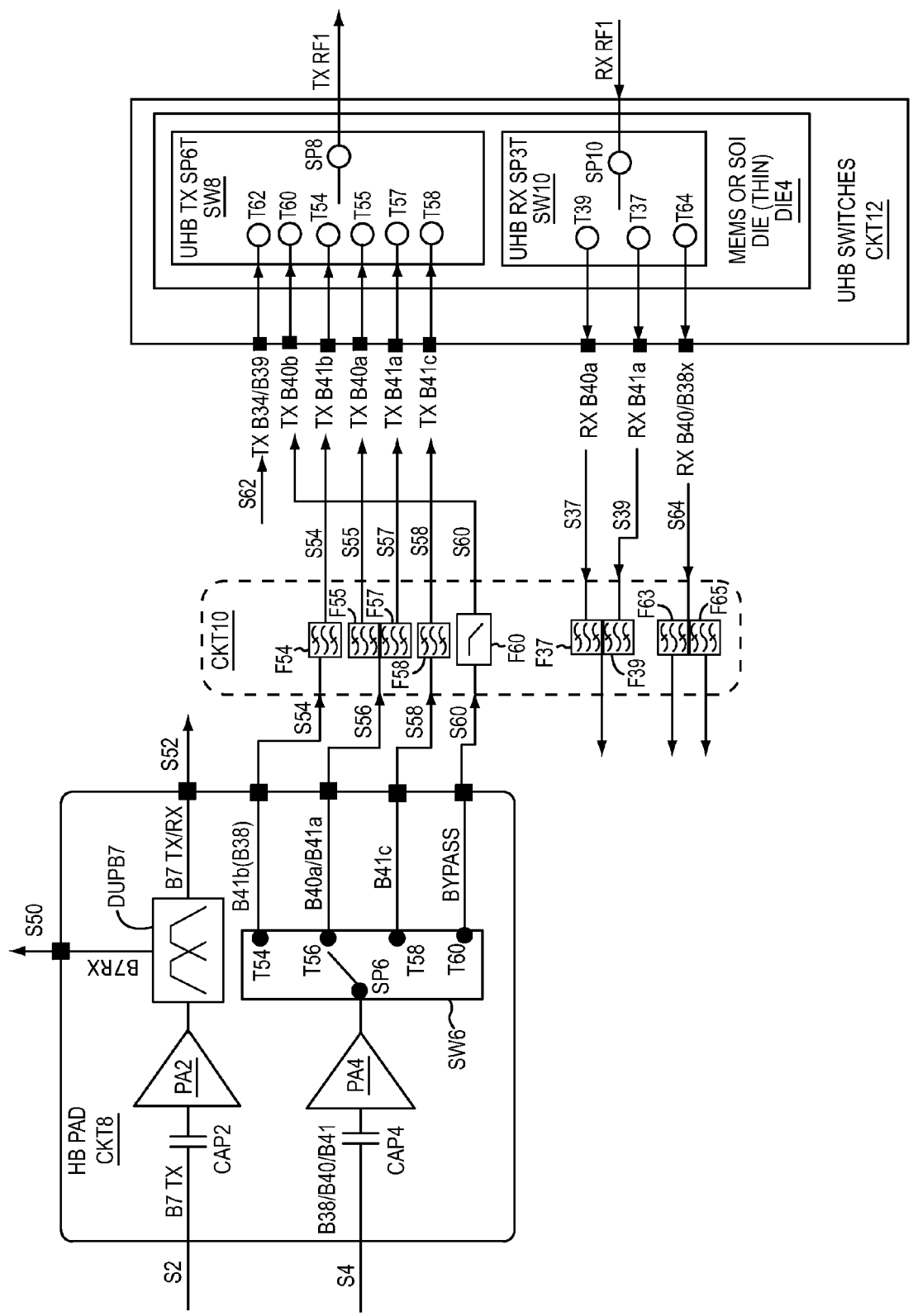
FIG. 3 illustrates a conventional high band pad CKT8, high band filters CKT10, and high band switches CKT12 from FIG. 1.
Figure 4:
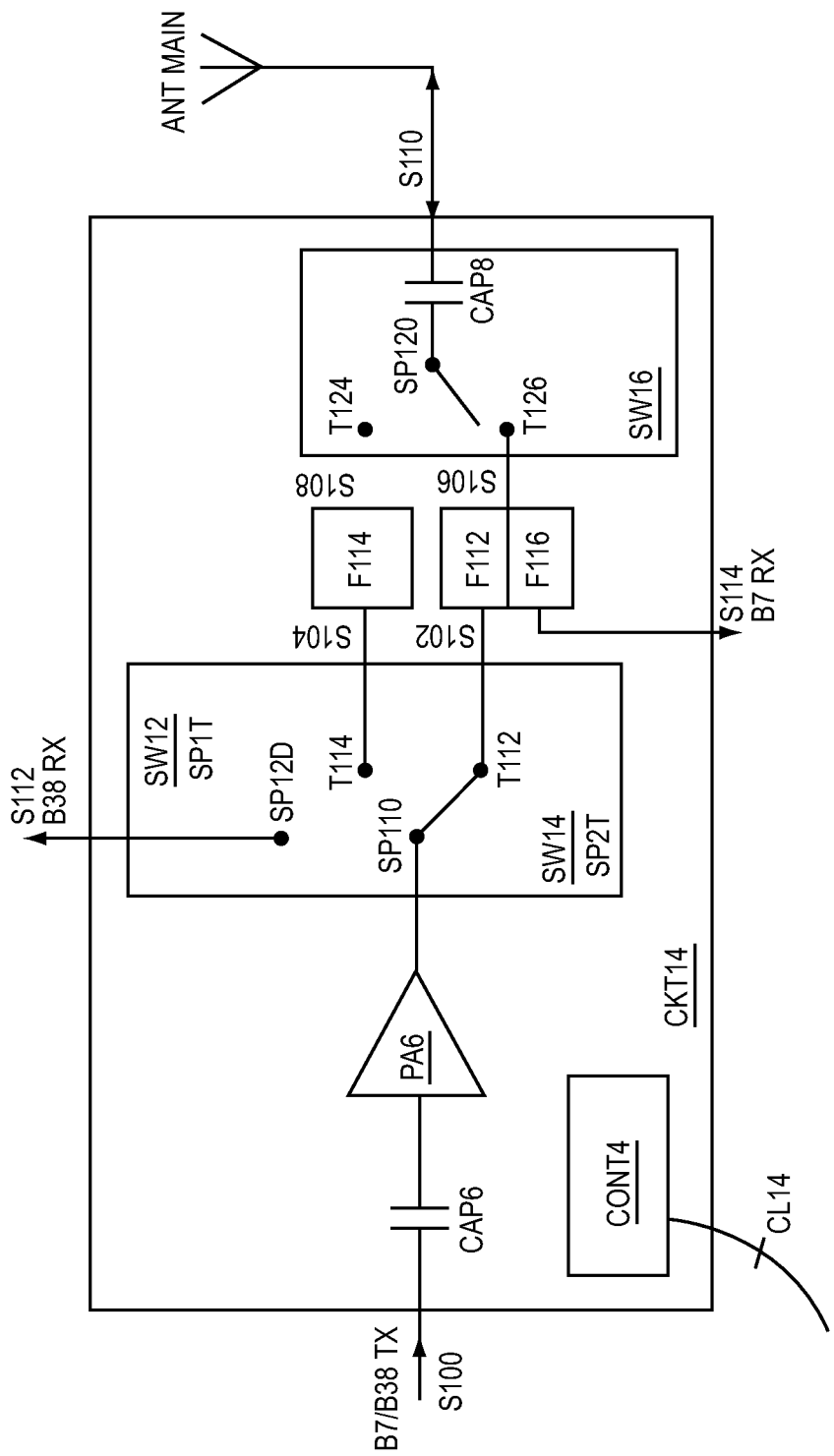
FIG. 4 illustrates a conventional single filter used for transmission and reception of a single band.

The upper portion of amplifier circuit CKT20 is configured for band 7, and is identical to the top portion of high band pad CKT8 in FIG. 3. In transmit mode for band 7, amplifier CKT20 receives signal S2 (band 7 being transmitted from node B7 TX), passes this signal through capacitor CAP2 (to filter undesired very low frequency signals), amplifies this signal with amplifier PA2, and sends filtered amplified signal S2 to duplexer DUPB7. Duplexer DUPB7 sends the amplified signal towards main antenna ANTMAIN (not shown) as signal S52 in transmit mode.

Alternatively, in receive mode for band 7, duplexer DUPB7 receives signal S52 from main antenna ANTMAIN, and sends this received signal as S50 towards a transceiver (not shown).

Die DIE8 includes tuning component TUN2 and switch SW24.

Starting at the lower left, capacitor CAP8 receives signal S320 (band B38 or B40 or B41 for transmission), and sends signal S322 to amplifier PA12. Amplifier PA12 sends signal S324 to throw T304 of switch SW24.

In a transmitting configuration, switch SW24 throws signal 324 to single pole SP300. Then single pole SP300 sends signal S326 to filter F310. Filter F310 (in a first mode, or transmission mode) transmits signal S328 towards an antenna (not shown).

Filter F310 is tunable, so that it may filter a band B38 signal, a band B40 signal, band XGP signal, or band B41 signal, depending upon how it is tuned. Tuning component TUN2 is part of filter F310, and may be located on a die holding switch SW24.

In a receiving configuration, received signals are indicated by dashed lines. Received signal S328 (starting at the lower right, and moving towards the left) is received by tunable filter F310 (in a second mode), sent to single pole SP300 of switch SW24, thrown to throw T302, then sent downward as S330 towards a transceiver (not shown).

Figure 6:
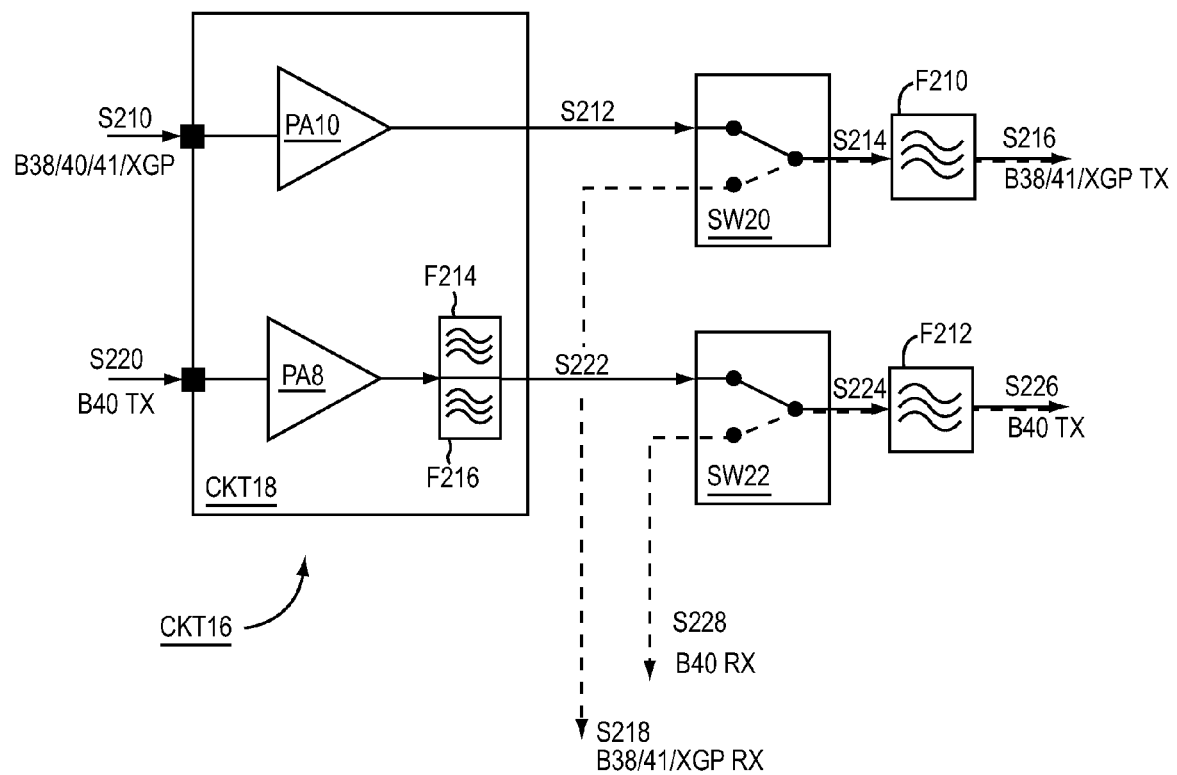
FIG. 6 illustrates using single filters (to transmit and receive) for multiple LTE bands.

Thus, tunable filter F310 may operate in a first mode transmitting in band B38, or (after switching from throw T304 to throw T302) in a second mode receiving band B38. After tuning to band B40, then tunable filter F310 may operate in a first mode transmitting in band B40, or (after switching from throw T304 to throw T302) a second mode receiving in band B40. In this fashion, tunable filter F310 serves the role of at least 4 different filters: transmit band B38, receive band 38, transmit band B40, and receiver band B40. Further, if filter F310 tunably filters for two bands, then the associated single switch SW24 performs switching functions for two bands (replacing switch SW20 and switch SW22 in FIG. 6).

Coupled resonators (RES2 and RES4) act as a band pass filter, as shown in FIG. 8 discussed below.

FIG. 8 illustrates a manufacturing embodiment of FIG. 7. In FIG. 8, circuit CKT22 is an embodiment of power amplifier circuit CKT20 of FIG. 7, and includes laminate (or substrate) LAM2, power amplifier die DIE10 (including amplifiers PA2 and PA12, not shown) on top of laminate LAM2, die DIE8 (including switch SW24 and tuning element TUN2, not shown) on top of laminate LAM2, resonator RES2, resonator RES4 (magnetically coupled to RES2), via VIA2, via VIA4, and bumps BUMP1 through BUMP4. Bumps BUMP1 through BUMP4 may be solder, or may be rectangular copper pillars (with low resistance), or other known attachment structures. The resonators may be magnetically coupled, and may include additional resonators.

Power amplifier die DIE10 may be GaAs or CMOS or SiGe. Die DIE8 may include switch SW24 (not shown) for selecting between a first mode (transmitting or TX) and a second mode (receiving or RX), and may include a tunable component TUN2 (not shown) of tuning filter F310 (not shown). Tunable component TUN2 may include a tunable array of capacitors for tuning filter F310. Tunable filter F310 may be a bandpass TDD filter, may include RES2 and RES4, and may include tunable component TUN2 located on die DIE8.

DIE8 and DIE10 may be a single package on a single laminate LAM2, as shown.

The manufacturing embodiment of FIG. 3 may be applied to any ASM (antenna switch module) where a single die includes band switching and tuning for LTE-TDD filters.

Figure 9:
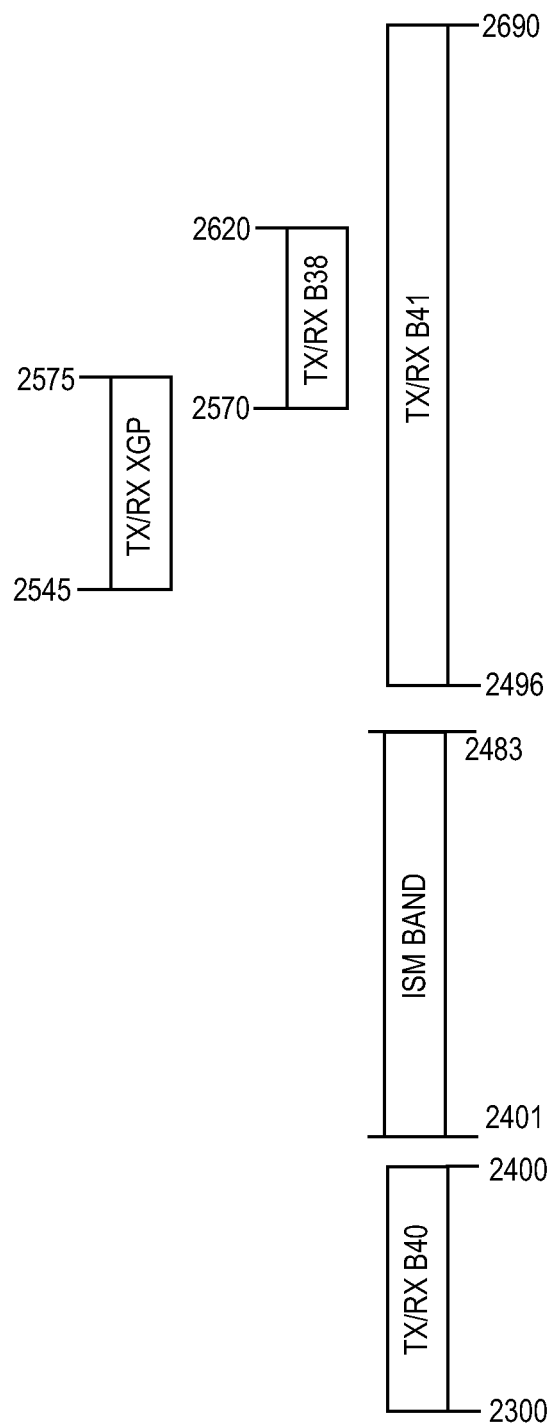
FIG. 9 illustrates some conventional bands of LTE-TDD (in MHz).

FIG. 9 illustrates some conventional bands of LTE-TDD (in MHz). Band B40 ranges from 2300 to 2400 (large bandwidth of 100 MHz). Band ISM (Industrial, Scientific, and Medical, including WiFi) ranges from 2401 to 2483 (bandwidth of 82 MHz). Band B41 ranges from 2496 to 2690 (very large bandwidth of 194 MHz, for U.S.). Broadly speaking, these three bands may be referred to as a low band, a central band (or exclusion band), and a high band respectively.

Together, bands B40 and B41 may be described as a "split-band" range, because the combined range is split into a low band (B40) and a high band (B41) by the central band ISM which must be avoided or excluded.

Band B41 encompasses bands XGP and B38. Band XGP (for Japan) ranges from 2545 to 2575 (bandwidth of 30 MHz). Band B38 (for European Union) ranges from 2570 to 2620 (bandwidth of 50 MHz).

It is difficult to build filters simultaneously having large bandwidths and having large attenuation at close offset frequencies (a "brick wall" at the end of the range of the filter). This difficulty also applies to tunable filters.

Thus, it is difficult to build a single filter for receiving in band B40 due to its large bandwidth (100 MHz) and its adjacency (at the high end, 2400 MHz) to the low end of the ISM band (2401 MHz). Similarly, it is difficult build a single filter for band B41 due to its very large bandwidth (194 MHz) and its adjacency (at the low end, 2496 MHz) to the high end of the ISM band (2483 MHz). Thus, multiple filters may be used to cover band B40, as shown in FIG. 10.

Figure 10:
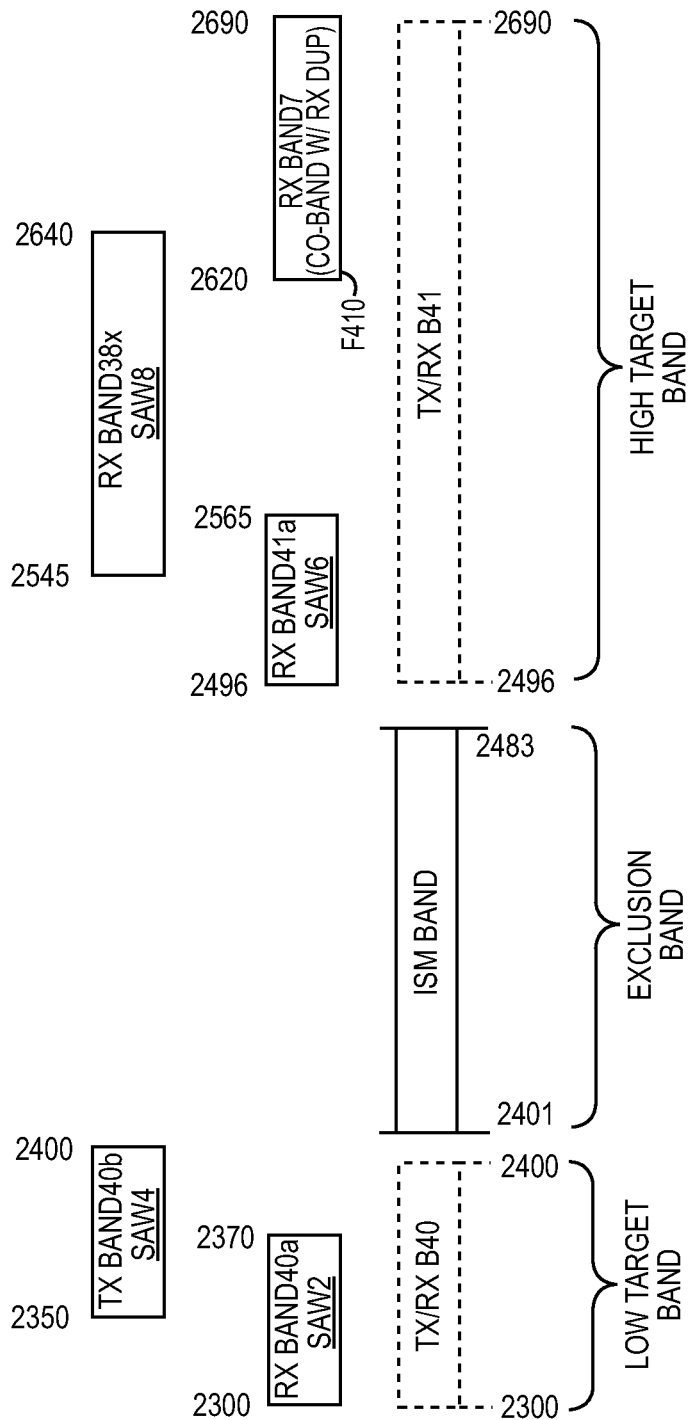
FIG. 10 illustrates a conventional overlapping bandwidth approach for receiving signals in band B40 by overlapping two SAW (Surface Acoustic Wave) filters (SAW2 and SAW4) to filter the entire range of band B40.

FIG. 10 illustrates a conventional overlapping bandwidth approach for receiving signals. This approach receives signals in band B40 (low target band) and in band B41 (high target band). The ISM band (exclusion band) is intentionally excluded from (filtered out of) the received signals.

SAW filters provide good edge characteristics. The upper edge (at 2400 MHz) of SAW filter SAW4 coincides with the upper edge of band B40 (2400 MHz). SAW4 passes signals at the upper edge of band B40 (the low target band in this example), and excludes signals at the lower edge of the exclusion band.

SAW6 similarly (or symmetrically) provides good edge characteristics, passing signals at the lower edge of band B41 (at 2496 MHz), and excluding signals at the high edge of the exclusion band (2483 MHz).

Receiving (RX) in band B40 is performed by using two overlapping SAW (Surface Acoustic Wave) filters (SAW2 and SAW4) to filter the entire range of band B40.

Specifically, band B40 is received by an overlapping combination of B40a (2300 to 2370 MHz, using filter SAW2) and band B40b (2350 to 2400 MHz, using filter SAW4). These two bands overlap by 20 MHz due to a 20 MHz maximum modulation bandwidth for SAW filters.

Similarly, band B41 is received by overlapping combinations of band B41a (2496 to 2565 MHz, by SAW6), band B38x (2545 to 2640 MHz, by SAW8), and band B7 (2620 to 2690 MHz, by filter F410). Band B38x overlaps with band B41a by 20 MHz, and overlaps with band B7 by 20 MHz, due to a 20 MHz maximum modulation bandwidth for SAW filters.

Filter F410 may be a "reused" band 7 filter (not shown) from a duplexer (not shown), which is also being "reused" to filter the upper part of band B41 (in addition to being used to filter band B7) In other words, this filter may be defined as filtering band B7 and band B41c.

Figure 11:
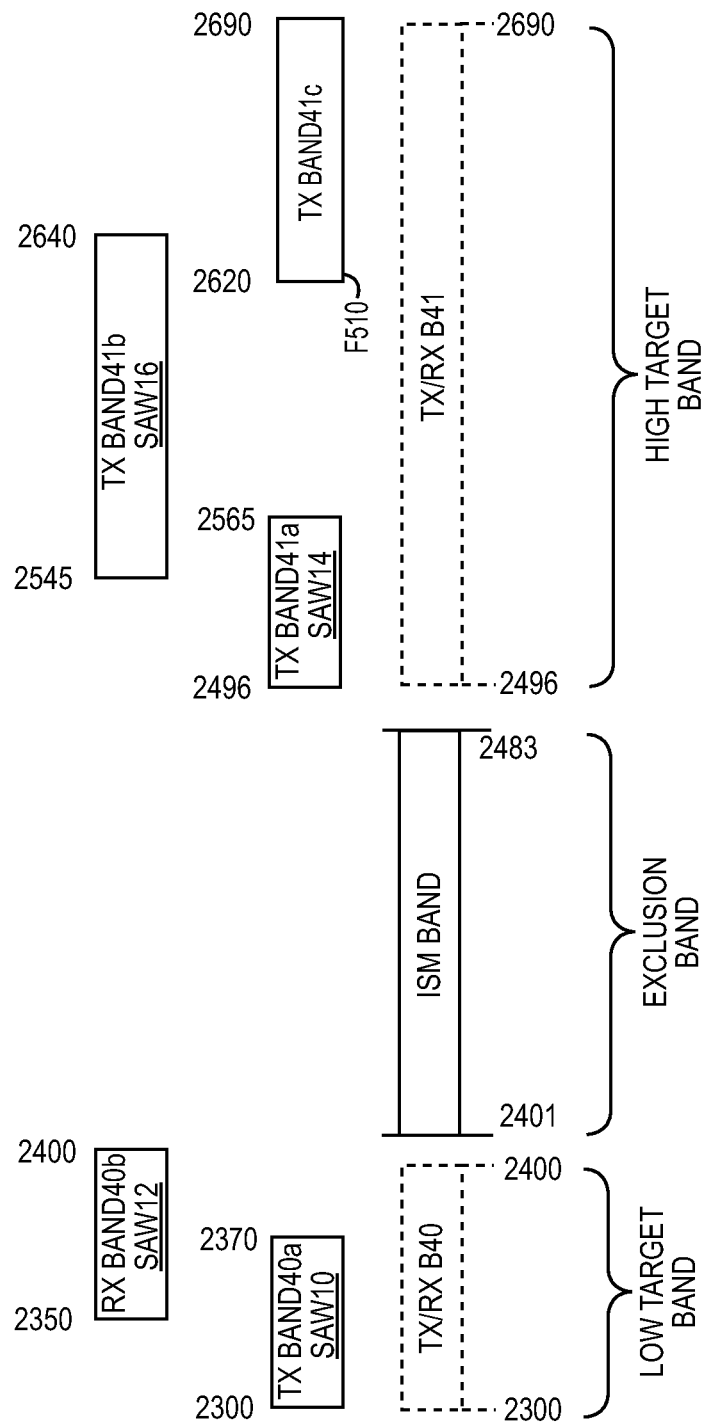
FIG. 11 is similar to FIG. 10, but illustrates a dedicated filter F510 for transmitting in band 41c.

FIG. 11 illustrates a transmitting configuration similar to the receiving configuration of FIG. 10, and illustrates a dedicated filter F510 for transmitting in band B41c. SAW filters SAW10 and SAW12 overlap to transmit all of band B40. Filters SAW14, SAW16, and F510 overlap to transmit all of band B41.

Similar to FIG. 10, SAW filters are used at the high edge of the low target band and at the low edge of the high target band.

Figure 12:
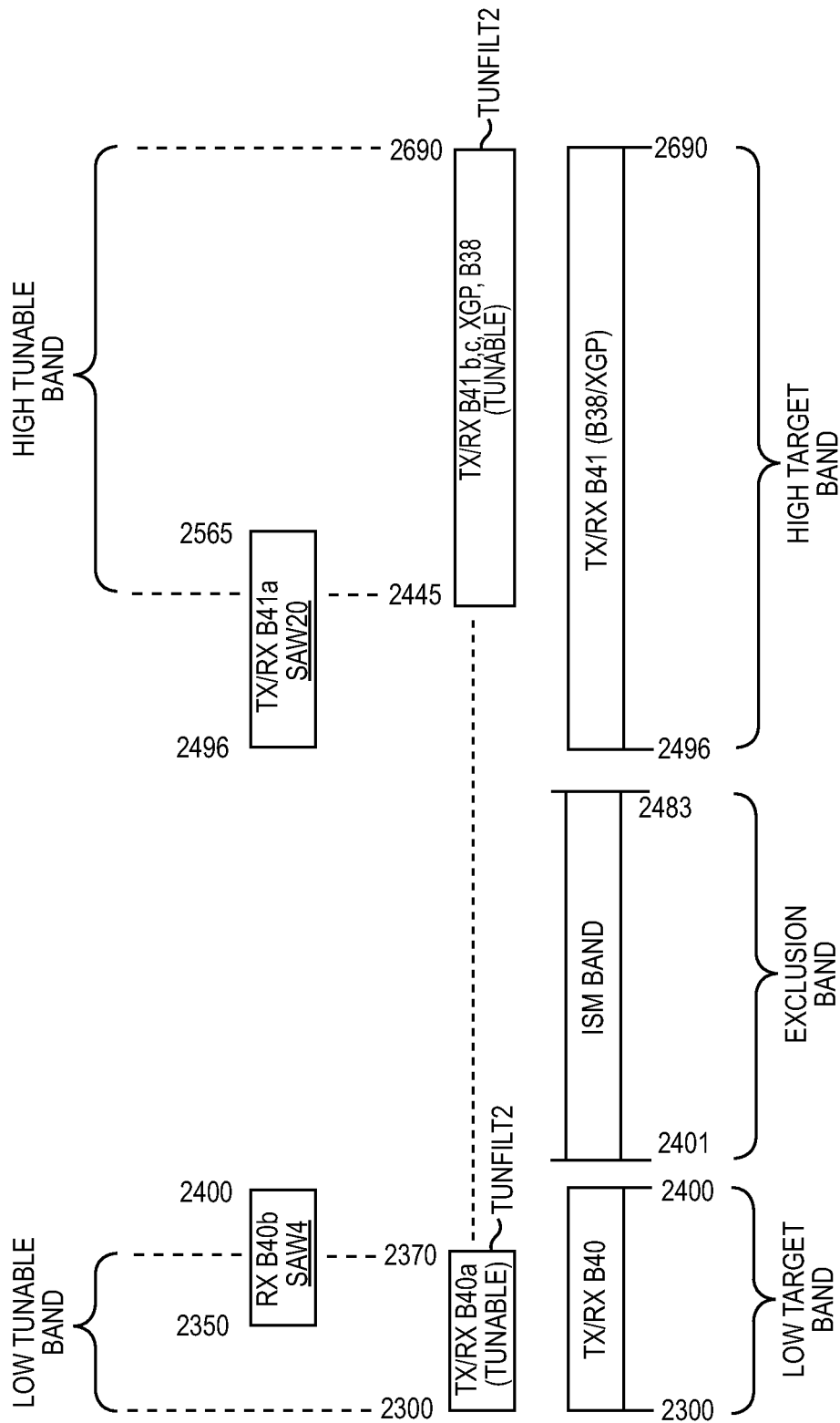
FIG. 12 illustrates using one tunable filter in combination with two SAW filters to achieve split band coverage around the ISM band.

FIG. 12 illustrates using one tunable filter in combination with two SAW filters to achieve split band coverage around the ISM band (the central or exclusion band). As shown in FIGS. 9-11, the three bands of interest for this embodiment are bands B40 (low target band), ISM (to be avoided), and B41 (high target band). As previously discussed, these filters may be used for receiving and for transmitting in TDD, with appropriate switching.

A tunable filter TUNFILT2 is configured to cover a low tunable band and a high tunable band. In FIG. 12, the low tunable band is labeled B40a (2300 MHz to 2370 MHz, thus staying at least 20 MHz away from the lower edge of the exclusion band band).

SAW filter SAW4 (band B40b) overlaps with the low tunable band (by 20 MHz), and combines with the low tunable band to completely cover low target band (B40, from 2300 to 2400 MHz).

As discussed in previous figures, a SAW filter (SAW4) is used to filter the upper edge of the low target band, adjacent to the lower edge of the exclusion band.

Tunable filter TUNFILT2 is also configured to cover most of the upper part of band B41 (2545 to 2690, or Bands B41b, B41c, XGP, and B38), thus staying at least 20 MHz away from the top of the exclusion band). See right portion of range of tuning component TUN4.

As discussed above, in order to fully cover band B40, SAW filter SAW4 filters band B40b (2350 to 2400). This range overlaps with band B40a by at least 20 MHz, and also provides a good cutoff at 2400 MHz to avoid interference with the lower edge of the ISM band (the central or exclusion band). SAW Filter SAW4 may be described as a narrow edge filter, because it has a relatively narrow range and because it filters the upper edge of band B40.

Similarly, in order to fully cover band B41 (a high band), SAW filter SAW20 filters band B41a (2496 to 2565). This range overlaps with TUNFILT2 by at least 29 MHz, and provides a good cutoff at 2496 in order to avoid interference with the upper edge of the ISM band (the central or exclusion band). Filter SAW20 may also be described as a narrow edge filter.

Figure 13:
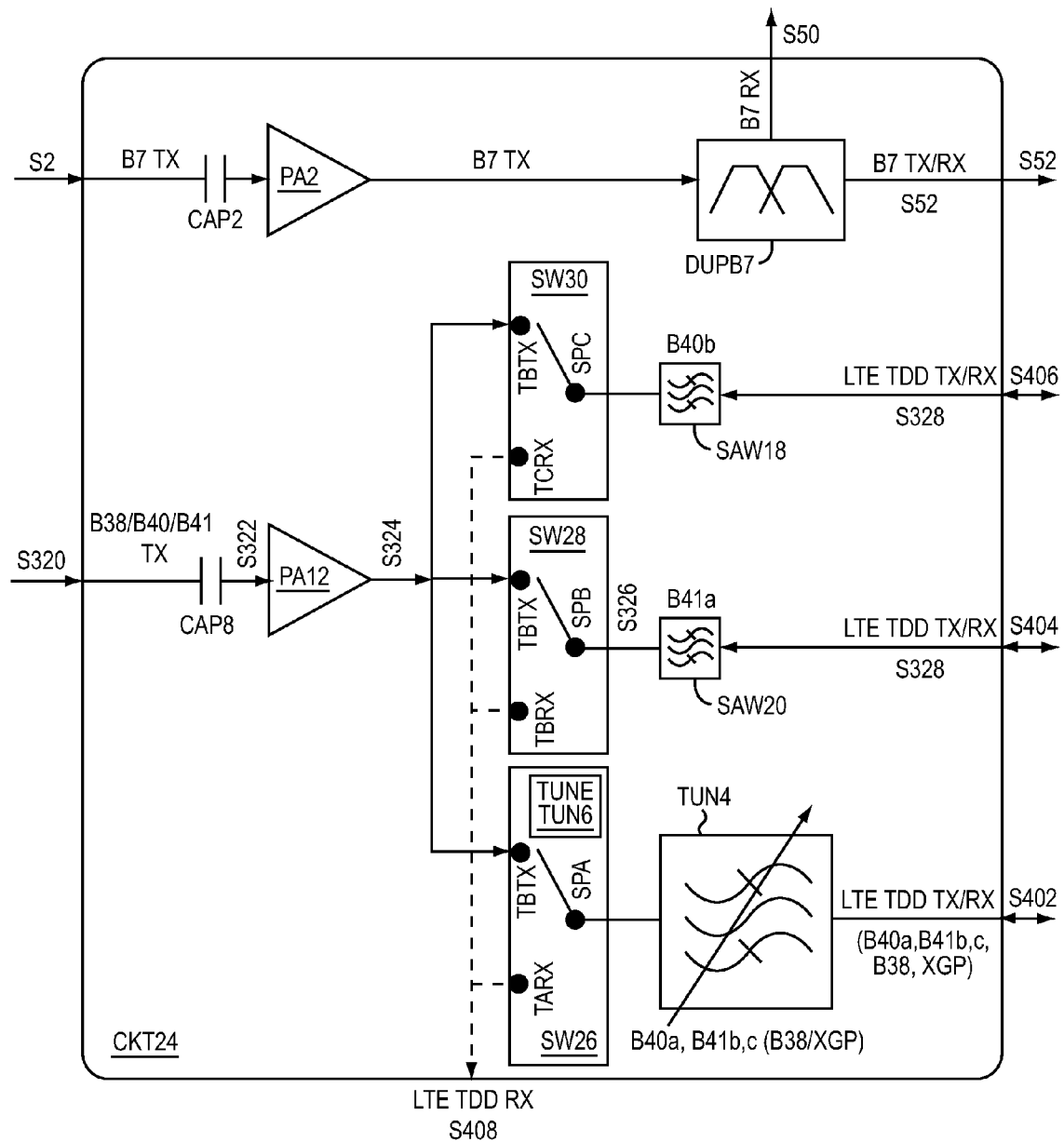
FIG. 13 illustrates using a tunable filter and two narrow edge SAW filters to provide split band coverage around a central band.

FIG. 13 illustrates a switching configuration using a tunable filter and two narrow edge SAW filters to provide split band coverage around a central or exclusion band. Specifically, amplifier circuit CKT24 is very similar to amplifier circuit CKT20 in FIG. 7, but is modified to provide split band coverage.

Figure 5A:
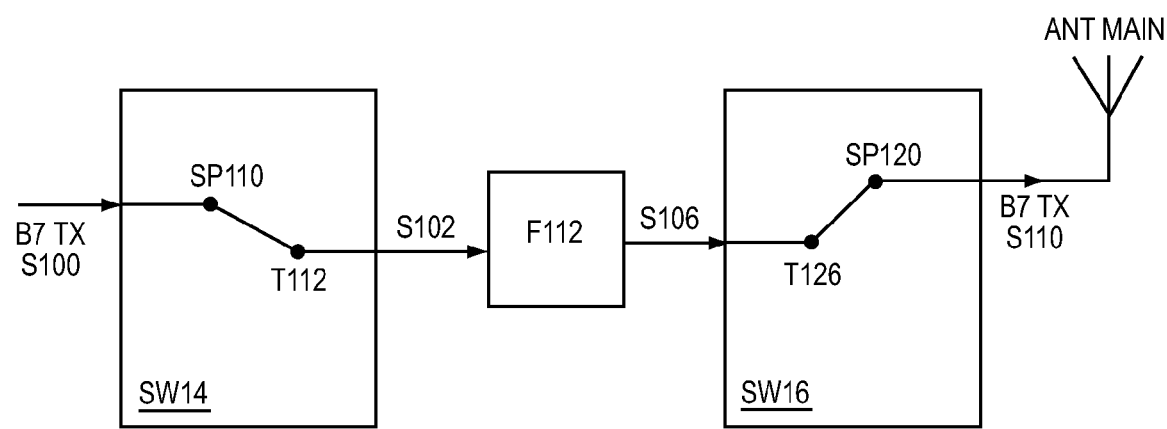
FIGS. 5A-5D illustrate the use of a single filter (F114) for transmitting and receiving in band 38 for LTE-TDD communications.
Figure 5B:
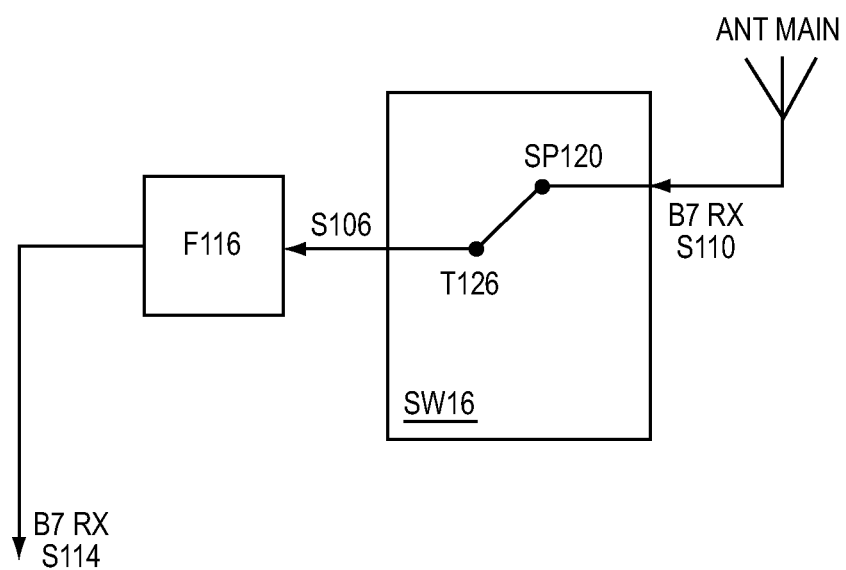
Figure 5C:
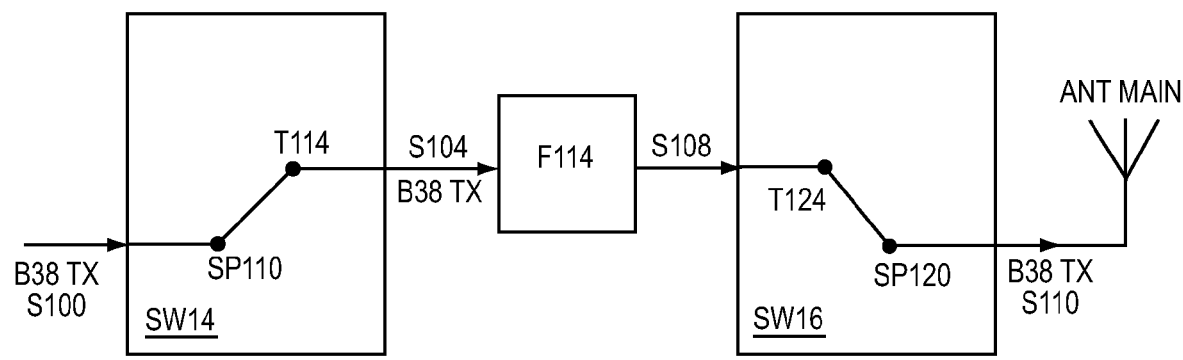
Figure 5D:
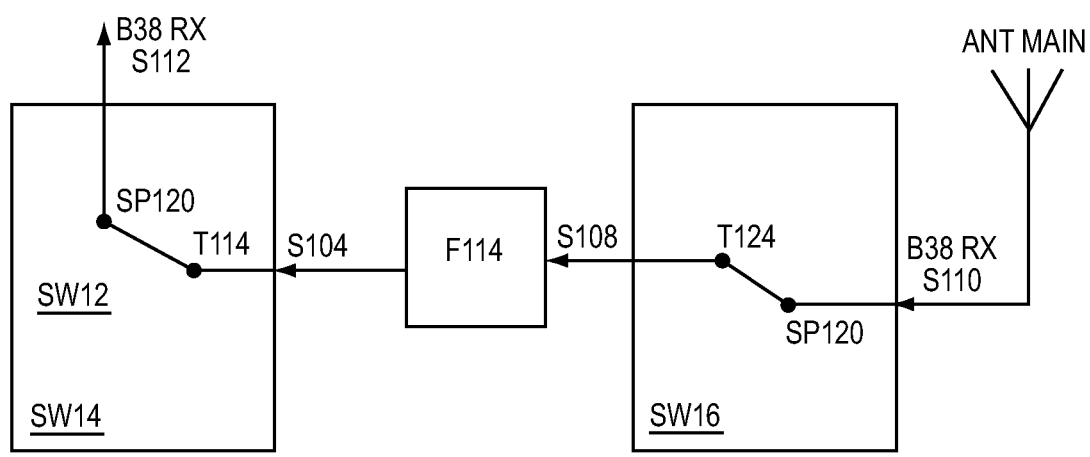

The use of SPDT (single pole double throw) switches to facilitate a single filter being used for transmitting and receiving in TDD was described in FIG. 5C and FIG. 5D respectively for band b38.

For the purpose of this specification, the term "SPDT" should be interpreted broadly. For example, a SP3T (single pole triple throw) switch includes a SPDT switch, but merely has an additional throw available. In other words, adding an additional throw (or an additional pole) for some other purpose does not prevent infringement.

Transmission signal S320 (including bands B38, B40, and B41) routes to three switches: SW26, SW28, and SW30. These switches are shown on the power amplifier side of the dual purpose filters, but may alternatively be located on the antenna side of the dual purpose filters (not shown) with a slightly different configuration (not shown).

When transmitting in the tunable filter range ("split range") of 2300-2370 or 2545-2690, then switch SW26 receives signal S320 at throw TbTX and routes this signal to single pole SPA. Single pole SPA sends this signal to tunable filter TUN4. Tunable filter TUN4 filters signal S320 to pass band B40a, or filters to pass bands B41b and B41c, or filters to pass band B38, or filters to pass band XGP (depending upon how tunable filter TUN4 is tuned). Tunable filter TUN4 passes a tuned signal S402 towards main antenna ANTMAIN (not shown).

Tunable filter TUN4 may include a tunable component TUN6 that may be located on a die with switch SW26, similar to the discussions above for FIGS. 7 and 8. Alternatively, component TUN6 may be a control portion that controls tunable filter TUN4.

In the reverse direction, when receiving in the tunable filter range ("split range") of 2300-2370 or 2545-2690, then tunable filter TUN4 receives signal S402 from main antenna ANTMAIN (not shown). Tunable filter TUN4 filters signal S320 to pass band B40a, or filters to pass bands B41b and B41c, or filters to pass band B38, or filters to pass band XGP (depending upon the tuning of tunable filter TUN4).

Tunable filter TUN4 passes a filtered signal S408 to pole SPA of switch SW26. Pole SPA passes (not shown) the filtered signal S408 to throw TARX. Throw TARX sends filtered signal S408 to a transceiver (not shown). In FIG. 13, switch SW26 is shown in the transmission position, but may be switched to throw TARX for receiving in TDD.

For band B41a, switch SW28 acts similarly to switch SW26. Filter SAW20 filters transmission of signal S320 or reception of signal S404 in band B41a, depending upon the selection of switch SW28.

For band b40b, switch SW30 acts similarly to switch SW28. Filter SAW18 filters transmission of signal S320 or reception of signal S406 in band B40b, depending upon the selection of switch SW30.

Figure 14:
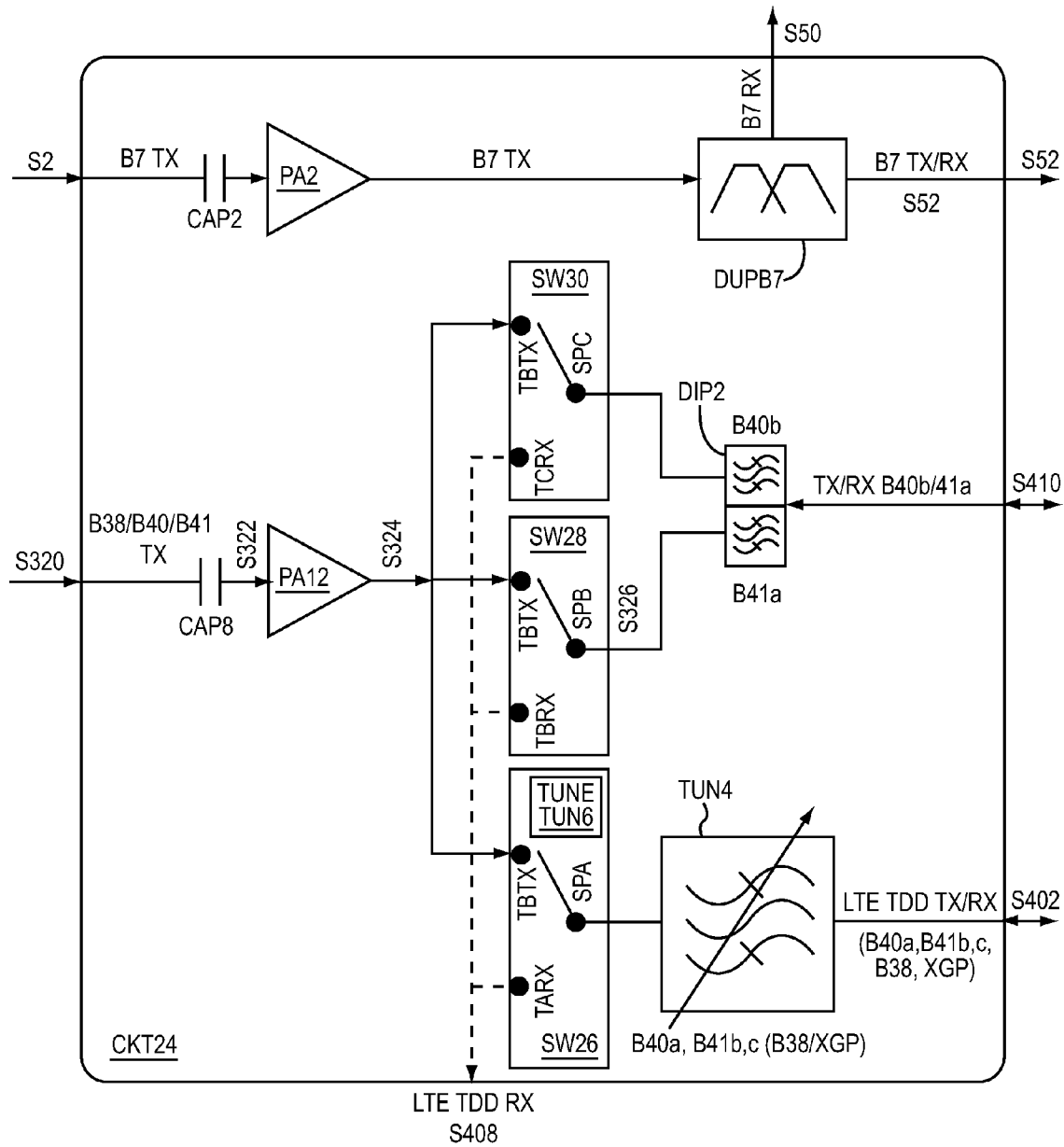
FIG. 14 is similar to FIG. 13, except that filters SAW18 and SAW20 from FIG. 13 have been replace by (or "merged into") diplexer DIP2. In this fashion, signal S410 replaces signals S404 and S406 from FIG. 13.

FIG. 14 is similar to FIG. 13, except that filters SAW18 and SAW20 from FIG. 13 have been replace by (or "merged into") diplexer DIP2. In this fashion, signal S410 replaces signals S404 and S406 from FIG. 13.

Figure 15:
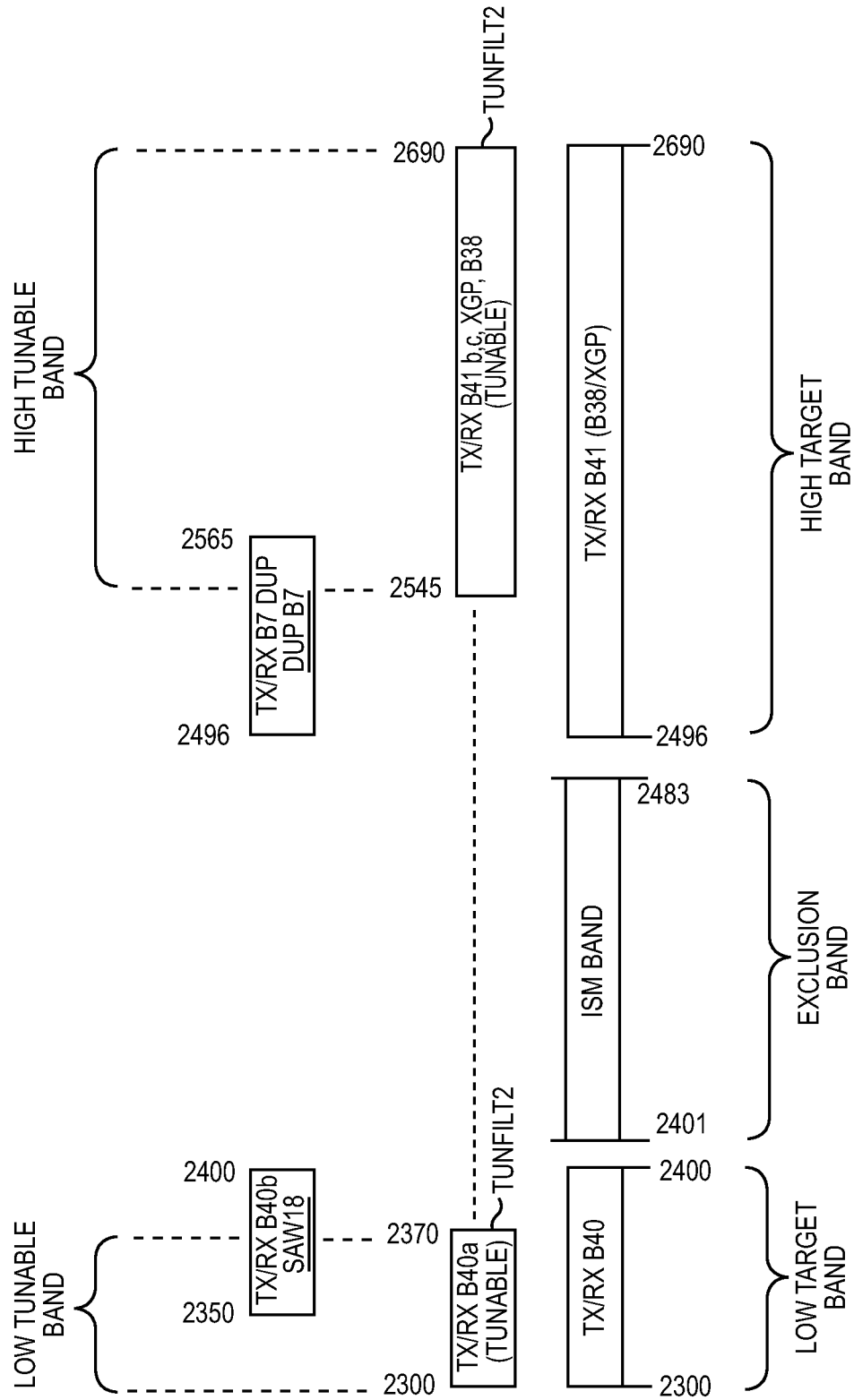
FIG. 15 is similar to FIG. 12, except that SAW20 (2496 to 2565) has been replaced by a band 7 range (2496 to 2570) of band 7 duplexer DUPB7.

FIG. 15 is similar to FIG. 12, except that SAW20 (2496 to 2565) has been replaced by a band B7 range (2496 to 2570) of band B7 duplexer DUPB7.

Figure 16:
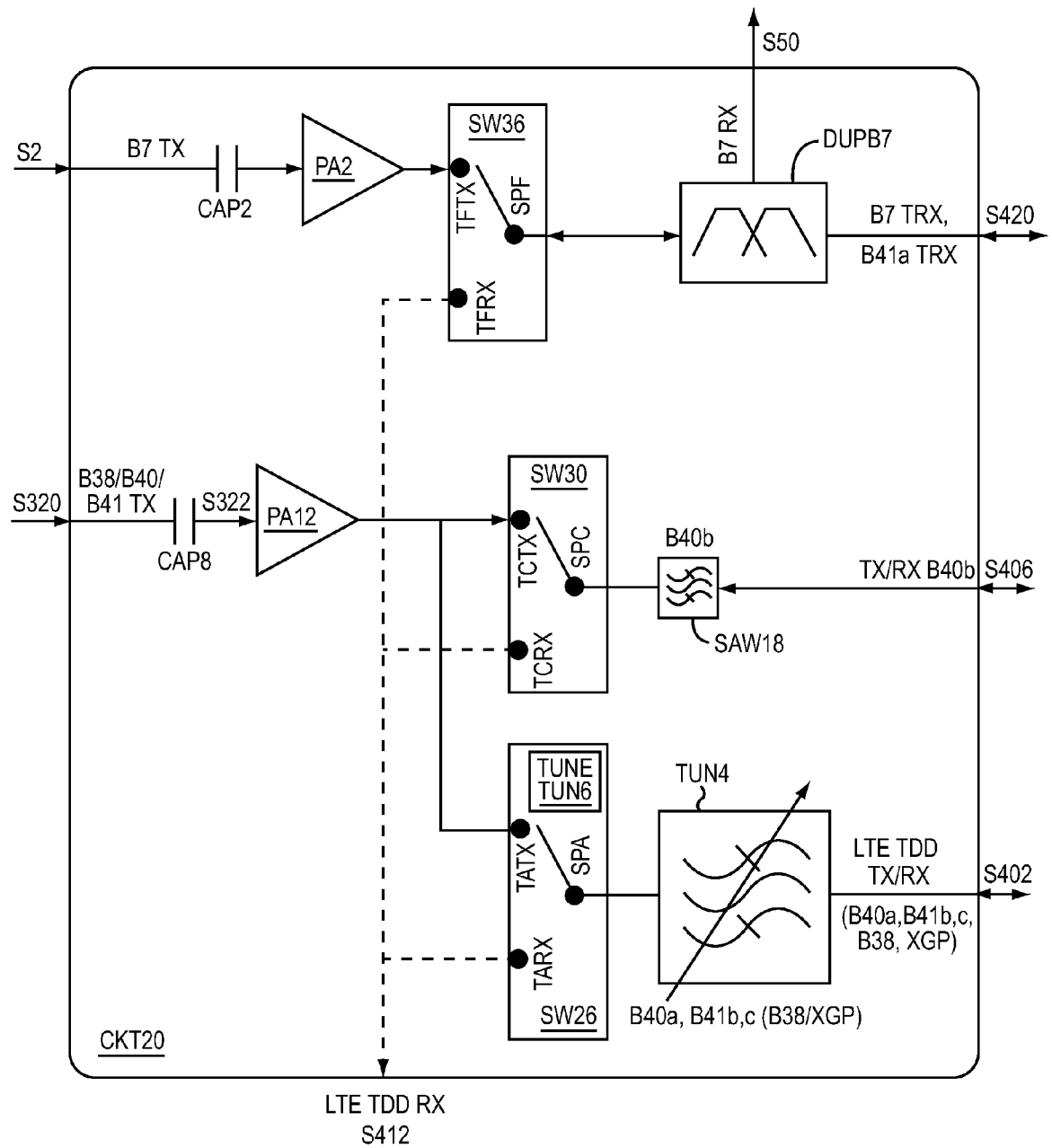
FIG. 16 is similar to FIG. 13, except that band 41a (2496 to 2565) filter SAW20 has been deleted.

FIG. 16 is similar to FIG. 13, except that band 41a (2496 to 2565) filter SAW20 has been deleted. The filtering duties of SAW20 have been effectively shouldered by band 7 (2496 to 2570) duplexer DUPB7.

To summarize, FIG. 16 employs one tunable filter TUN4 and one SAW filter SAW18 to accomplish the filtering that previously required eight filters in FIG. 3 (F54, F55, F57, F58, F37, F39, F63, and F65).

Figure 17:
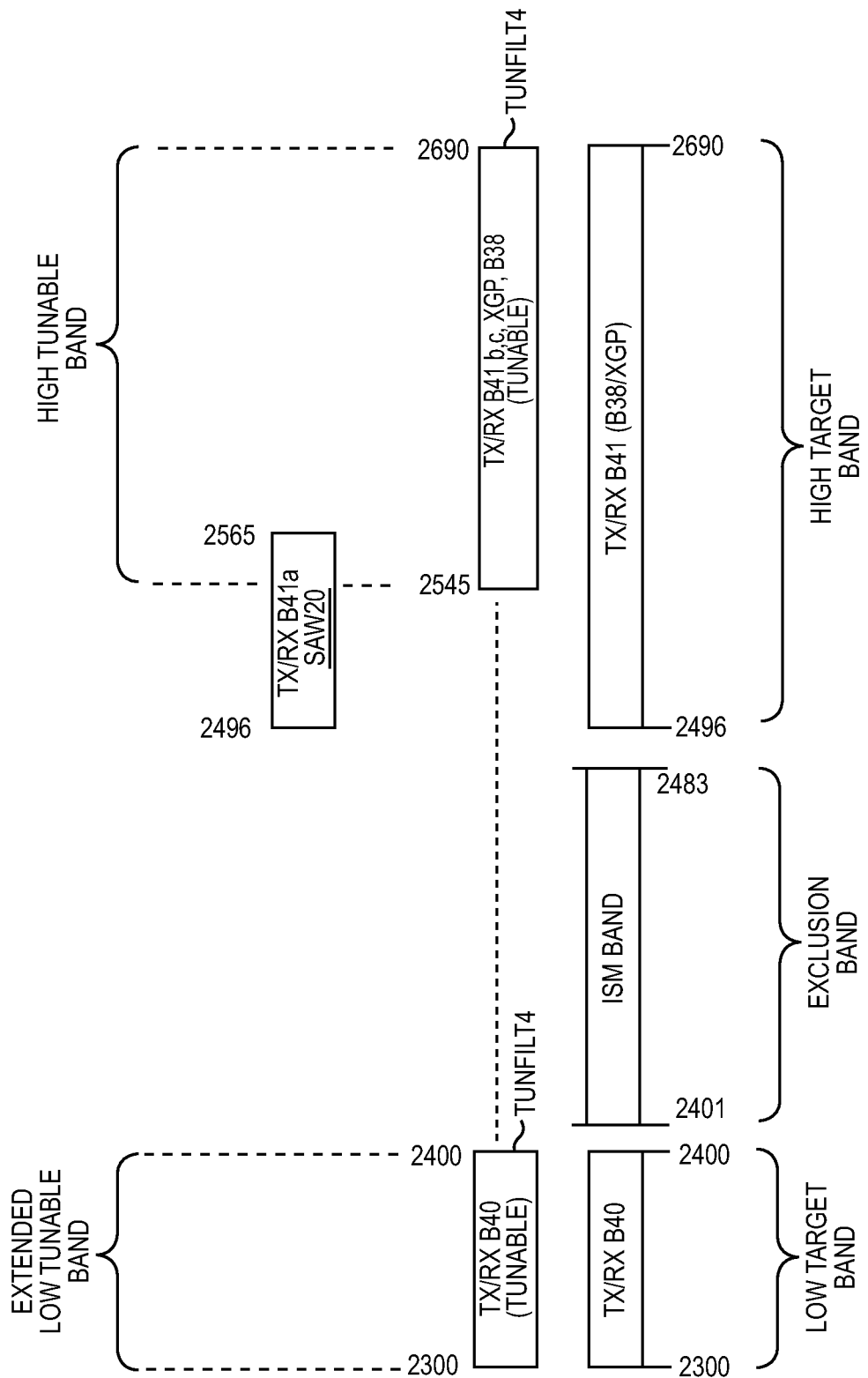
FIG. 17 is similar to FIG. 12, except that the left portion of the tunable filter band (band 40a (2300 to 2370)) has been replaced by an extended left portion of the tunable filter band (band 40 (2300 to 2400)).

FIG. 17 is similar to FIG. 12, except that the left portion of the tunable filter band (band B40a (2300 to 2370)) has been replaced by an extended left portion of the tunable filter band cover all of band B40 (band B40 (2300 to 2400)). Also, SAW 18 has been deleted, since it is no longer needed relative to FIG. 12. To document this change, the tuning component has been named TUNFILT4 (instead of TUNFILT2 as in FIG. 15). This extension of the left portion of the tunable filter band eliminates the need for SAW18 of FIG. 12.

Figure 18:
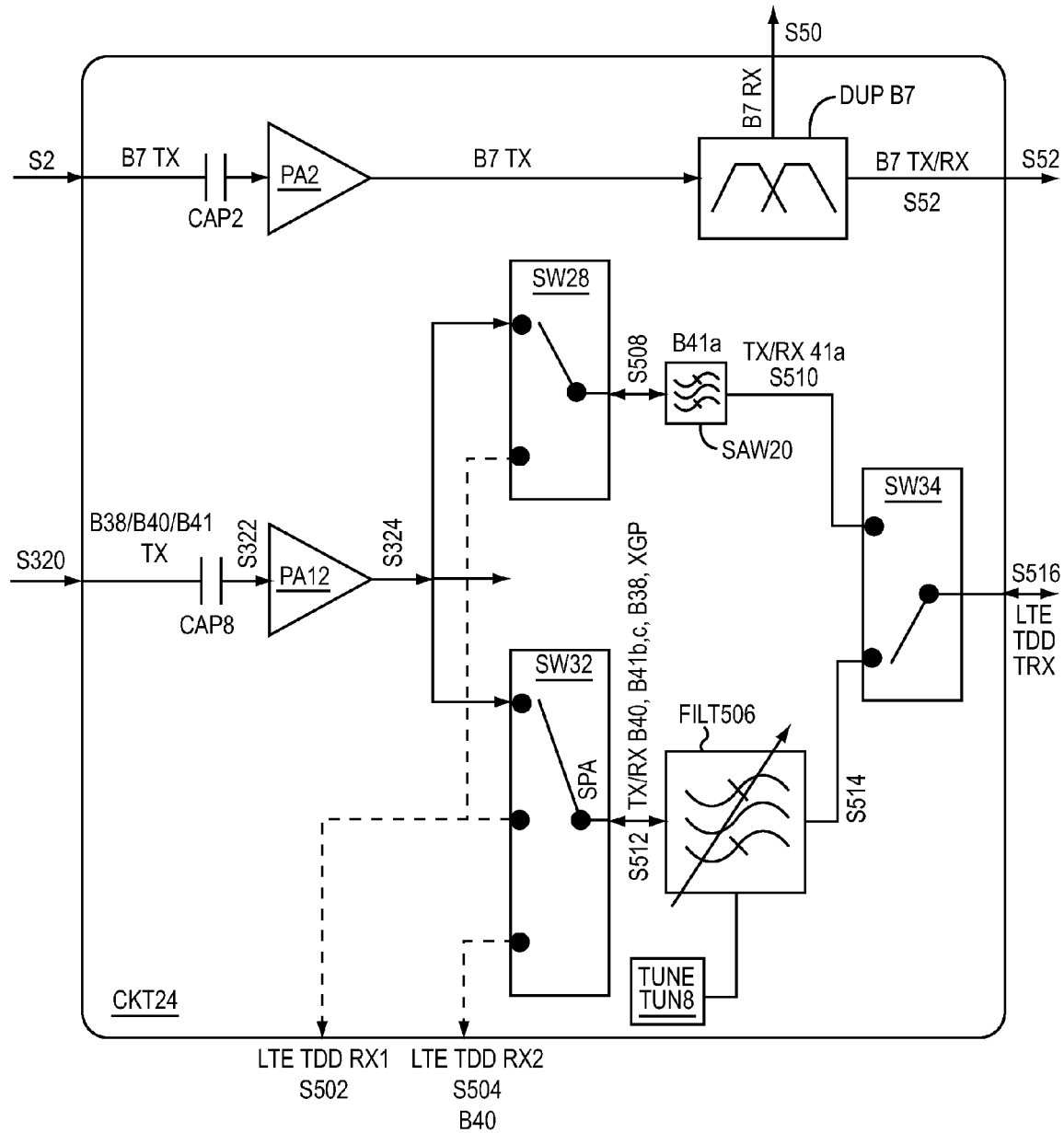
FIG. 18 illustrates circuitry implementing tuning component TUN8 of FIG. 17, and illustrating a few additional features.

FIG. 18 illustrates filtering component F506 and tuning component TUN8 of tunable filter TUNFILT4 of FIG. 17, and illustrates a few additional features. The bottom right portion of FIG. 18 is new, but the remainder of the figure is identical to FIG. 7. As discussed above regarding FIG. 17, SAW18 has been eliminated.

Filter SAW20 and switch SW28 are retained from FIG. 13 to handle band B41a. All other frequencies within bands B40 and B41 (excluding band B41a) are filtered by filtering component F506 and tuning component TUN8.

Switch SW32 is different from switch SW26 in FIG. 13. Switch SW32 is a SP3T switch, so that reception signals can be separated according to whether they are in the low portion of the tunable filter range (low band of the split band coverage), or in the high portion of the tunable filter range (high band of the split band coverage). If the received signal is in the low portion (B40), then this is routed by switch SW32 to RX2 as signal S504. If the received signal is in the high portion (B41b, B41c, B38, XGP), then this signal is routed by switch SW32 to RX1 as signal S502.

If the reception signal is in band B41a, then this signal is filtered by SAW20, and routed by switch SW28 to RX1 as signal S502. Thus, this reception signal in band B41a is routed to RX1, the same as the reception signals in the high portion of the tunable filter range. All relatively high frequency reception signals are routed to RX1.

In contrast, band B40 is in the lower portion of the tunable filter range, and reception signals in this range are routed to RX2 as signal S504.

Thus, FIG. 18 facilitates separate handling of received LTE TDD signals by a transceiver. This separate handling by the transceiver facilitates optimized matching by the transceiver, because the low portion is very different from the high portion (separated by almost 100 MHz).

A single die may include duplexer DUPB7, switch SW28, switch SW32, tunable component TUNS, and switch SW34. Filter component FILT506 may be located outside of the single die. This single die may be SOI (silicon on insulator).

Those skilled in the art will recognize improvements and modifications to the preferred embodiments of the present disclosure. All such improvements and modifications are considered within the scope of the concepts disclosed herein and the claims that follow.

What is claimed is:

1. An apparatus comprising:
   a filtering component having a filter terminal and a tuning terminal;
   a transmit/receive switch having a pole coupled to the filter terminal and a receive throw and a transmit throw;
   a tunable array of capacitors coupled to the tuning terminal, wherein the tunable array of capacitors and the filtering component are configured to filter first transmit signals and first receive signals within a first band that has an upper frequency edge that is below an exclusion band in a first mode and filter second transmit signals and second receive signals within a second band that has a lower frequency edge that is above the exclusion band in a second mode; and
   a first surface acoustical wave (SAW) transmit/receive filter having an upper filter edge that coincides with the upper frequency edge of the first band and a second SAW transmit/receive filter having a lower filter edge that coincides with the lower frequency edge of the second band, wherein both the first SAW filter and the second SAW filter are selectably coupled to the receive throw and the transmit throw.

2. The apparatus of claim 1 further comprising a duplexer having a lower filter edge that coincides with the lower frequency edge of the second band.

3. The apparatus of claim 2 wherein the lower frequency edge of the second band is 2496 MHz.

4. The apparatus of claim 3 wherein the duplexer has an upper filter edge that is 2565 MHz.

5. The apparatus of claim 1 wherein the upper frequency edge of the first band is 2400 MHz and the first SAW transmit/receive filter has a lower filter edge that coincides with 2350 MHz, and the lower frequency edge of the second band is 2496 MHz and the second SAW transmit/receive filter has an upper filter edge of 2565 MHz.

6. The apparatus of claim 1 wherein the apparatus is tunable within the first band between 2300 MHz and 2370 MHz in the first mode.

7. The apparatus of claim 1 wherein the apparatus is tunable within the second band between 2545 MHz and 2690 MHz in the second mode.

8. The apparatus of claim 1 wherein the exclusion band is the industrial, scientific, and medical band (ISM band).

9. The apparatus of claim 1 wherein the tunable array of capacitors and the transmit/receive switch are integrated together on a die.

10. An apparatus comprising:
    a filtering component having a filter terminal and a tuning terminal;
    a transmit/receive switch having a pole coupled to the filter terminal and a receive throw and a transmit throw;
    a tunable array of capacitors coupled to the tuning terminal, wherein the tunable array of capacitors and the filtering component are configured to filter first transmit signals and first receive signals within a first band that has an upper frequency edge that is below an exclusion band in a first mode and filter second transmit signals and second receive signals within a second band that has a lower frequency edge that is above the exclusion band in a second mode;
    a first surface acoustical wave (SAW) transmit/receive filter having an upper filter edge that coincides with the upper frequency edge of the first band and is selectably coupled to the receive throw and the transmit throw; and
    a duplexer having a lower filter edge that coincides with the lower frequency edge of the second band and is selectably coupled to the receive throw.

11. The apparatus of claim 10 wherein the first SAW transmit/receive filter has a lower filter edge that coincides with 2350 MHz and the upper frequency edge of the first band is 2400 MHz and the lower frequency edge of the second band is 2496 MHz.

12. The apparatus of claim 10 wherein the duplexer has an upper filter edge that is 2565 MHz.

13. The apparatus of claim 10 further including a second SAW transmit/receive filter having a lower filter edge that coincides with the lower frequency edge of the second band and is selectably coupled to the receive throw and the transmit throw.

14. The apparatus of claim 13 wherein the lower frequency edge of the second band is 2496 MHz and the second SAW transmit/receive filter has an upper filter edge of 2565 MHz.

15. The apparatus of claim 10 wherein the tunable array of capacitors and the transmit/receive switch are integrated together on a die.

* * * * *

UNITED STATES PATENT AND TRADEMARK OFFICE
CERTIFICATE OF CORRECTION

PATENT NO. : 9,906,354 B2
APPLICATION NO. : 14/254343
DATED : February 27, 2018
INVENTOR(S) : Nadim Khlat Page 1 of 1

It is certified that error appears in the above-identified patent and that said Letters Patent is hereby corrected as shown below:

In the Specification:

In Column 2, Line 51, replace "510 (filtered signal S9)" with --S10 (filtered signal S9)--.

In Column 4, Line 37, replace "capacitor CAPE" with --capacitor CAP8--.

In Column 11, Line 37, replace "B41band" and --B41b and--.

In Column 12, Line 63, replace "tunable component TUNS" with --tunable component TUN8--.

Signed and Sealed this
Twenty-ninth Day of May, 2018

Andrei Iancu
*Director of the United States Patent and Trademark Office*